US008862452B2

(12) United States Patent
Sagues

(10) Patent No.: US 8,862,452 B2
(45) Date of Patent: *Oct. 14, 2014

(54) CONTROL SYSTEM SIMULATOR AND SIMPLIFIED INTERCONNECTION CONTROL SYSTEM

(75) Inventor: Paul Sagues, Ross, CA (US)

(73) Assignee: XIO, Inc., Ross, CA (US)

( * ) Notice: Subject to any disclaimer, the term of this patent is extended or adjusted under 35 U.S.C. 154(b) by 641 days.

This patent is subject to a terminal disclaimer.

(21) Appl. No.: 13/069,292

(22) Filed: Mar. 22, 2011

(65) Prior Publication Data

US 2011/0231176 A1  Sep. 22, 2011

Related U.S. Application Data

(63) Continuation-in-part of application No. 12/911,445, filed on Oct. 25, 2010, now abandoned, which is a continuation of application No. 12/106,968, filed on Apr. 21, 2008, now Pat. No. 7,822,896, and a continuation-in-part of application No. 11/801,127, filed on May 7, 2007, now abandoned, which is a continuation of application No. 11/296,134, filed on Dec. 6, 2005, now Pat. No. 7,216,191, which is a continuation-in-part of application No. 11/043,296, filed on Jan. 25, 2005, now abandoned, which is a continuation-in-part of application No. 10/071,870, filed on Feb. 8, 2002, now Pat. No. 6,892,265.

(60) Provisional application No. 61/316,070, filed on Mar. 22, 2010, provisional application No. 60/950,040, filed on Jul. 16, 2007, provisional application No. 60/269,129, filed on Feb. 14, 2001.

(51) Int. Cl.
*G06G 7/62* (2006.01)
*G05B 17/02* (2006.01)

(52) U.S. Cl.
CPC .................................. *G05B 17/02* (2013.01)
USPC ............................................................ 703/13

(58) Field of Classification Search
USPC ............................................................ 703/13
See application file for complete search history.

(56) References Cited

U.S. PATENT DOCUMENTS

| 3,795,901 | A | 3/1974 | Boehm et al. |
| 4,360,913 | A | 11/1982 | Struger et al. |
| 4,695,955 | A | 9/1987 | Faisandier |
| 4,954,949 | A | 9/1990 | Rubin |
| 5,064,387 | A | 11/1991 | Lybrand |

(Continued)

FOREIGN PATENT DOCUMENTS

EP  0 436 458  A2  7/1991

OTHER PUBLICATIONS

International Search Report issued for PCT/US2011/29456 on May 27, 2011.

(Continued)

*Primary Examiner* — Dwin M Craig
(74) *Attorney, Agent, or Firm* — David H. Jaffer; Pillsbury Winthrop Shaw Pittman LLP

(57) ABSTRACT

A computer-based simulator, separate from a computer process control system, that simplifies the electrical interconnection of the computer-based simulator to the computer control system and reduces the number of hardware components required to effect a computer-based simulator. The invention also facilitates remote configuration and operation of the control and simulator systems.

5 Claims, 23 Drawing Sheets

(56) References Cited

U.S. PATENT DOCUMENTS

| | | | |
|---|---|---|---|
| 5,079,731 A | 1/1992 | Miller et al. | |
| 5,327,098 A | 7/1994 | Molina et al. | |
| 5,371,858 A | 12/1994 | Miller et al. | |
| 5,379,184 A | 1/1995 | Barraza et al. | |
| 5,423,697 A | 6/1995 | MacGregor | |
| 5,426,738 A * | 6/1995 | Hsieh et al. | 326/38 |
| 5,596,169 A | 1/1997 | Baker et al. | |
| 5,630,170 A | 5/1997 | Koizumi et al. | |
| 5,635,841 A | 6/1997 | Taylor | |
| 5,659,800 A | 8/1997 | Zhang et al. | |
| 5,696,988 A | 12/1997 | Dale et al. | |
| 5,701,515 A | 12/1997 | Gradeler | |
| 5,872,999 A | 2/1999 | Koizumi et al. | |
| 5,897,399 A | 4/1999 | Emery | |
| 5,905,249 A | 5/1999 | Reddersen et al. | |
| 5,938,754 A | 8/1999 | Edwards et al. | |
| 5,983,290 A | 11/1999 | Obata et al. | |
| 6,077,125 A | 6/2000 | Emery | |
| 6,294,928 B1 * | 9/2001 | Lytle et al. | 326/41 |
| 6,301,633 B1 | 10/2001 | Chapman | |
| 6,349,235 B1 | 2/2002 | Gibart et al. | |
| 6,375,344 B1 | 4/2002 | Hanson et al. | |
| 6,553,432 B1 | 4/2003 | Critz et al. | |
| 6,651,877 B2 | 11/2003 | Fukuda et al. | |
| 6,892,265 B2 | 5/2005 | Sagues et al. | |
| 6,980,638 B1 | 12/2005 | Smith et al. | |
| 7,003,608 B2 | 2/2006 | Brudseth | |
| 7,103,802 B2 | 9/2006 | Stephens et al. | |
| 7,206,399 B2 | 4/2007 | Smith et al. | |
| 7,216,191 B2 | 5/2007 | Sagues et al. | |
| 7,231,553 B2 | 6/2007 | Stephens et al. | |
| 7,822,896 B1 | 10/2010 | Sagues et al. | |
| 2003/0154061 A1 | 8/2003 | Willis | |
| 2003/0220785 A1 | 11/2003 | Collins et al. | |
| 2005/0052187 A1 | 3/2005 | Bertness | |
| 2005/0071035 A1 | 3/2005 | Strang | |
| 2005/0130459 A1 | 6/2005 | Sagues et al. | |
| 2006/0155900 A1 | 7/2006 | Sagues et al. | |
| 2006/0166685 A1 | 7/2006 | Adkins | |
| 2006/0183436 A1 | 8/2006 | Adkins | |
| 2006/0235637 A1 * | 10/2006 | Brayton et al. | 702/113 |
| 2007/0194793 A1 | 8/2007 | Bertness | |

OTHER PUBLICATIONS

"A connector-aware middleware for distributed deployment and mobility" by Mikjc-Rakjc, M.; Medvidovic, N. (abstract only) Publication Date: May 19-22, 2003.

A new approach to couple/decouple networks for EMC testing: by Marshall, R.C. (abstract only) Publication Date: Jul. 12-13, 1999.

"An externally powered, multichannel, implantable stimulator-telemeter for control of paralyzed muscle" by Smith et al. (abstract only) Publication Date: Apr. 1998.

"High performance mainframe computer cables" by Beaman, B. (abstract only) Publication Date: May 18-21, 1997.

"High-density and high-pin count flexible SMD connector for high-speed data bus" by Sasaki, S; Kishimoto, T. (abstract only) Publication Date: Oct. 4-6, 1993.

"The effects of the Main Variables in the percussive Arc Welding of Electrical interconnections" by Holley et al. (abstract only) Publication Date: Dec. 1965.

* cited by examiner

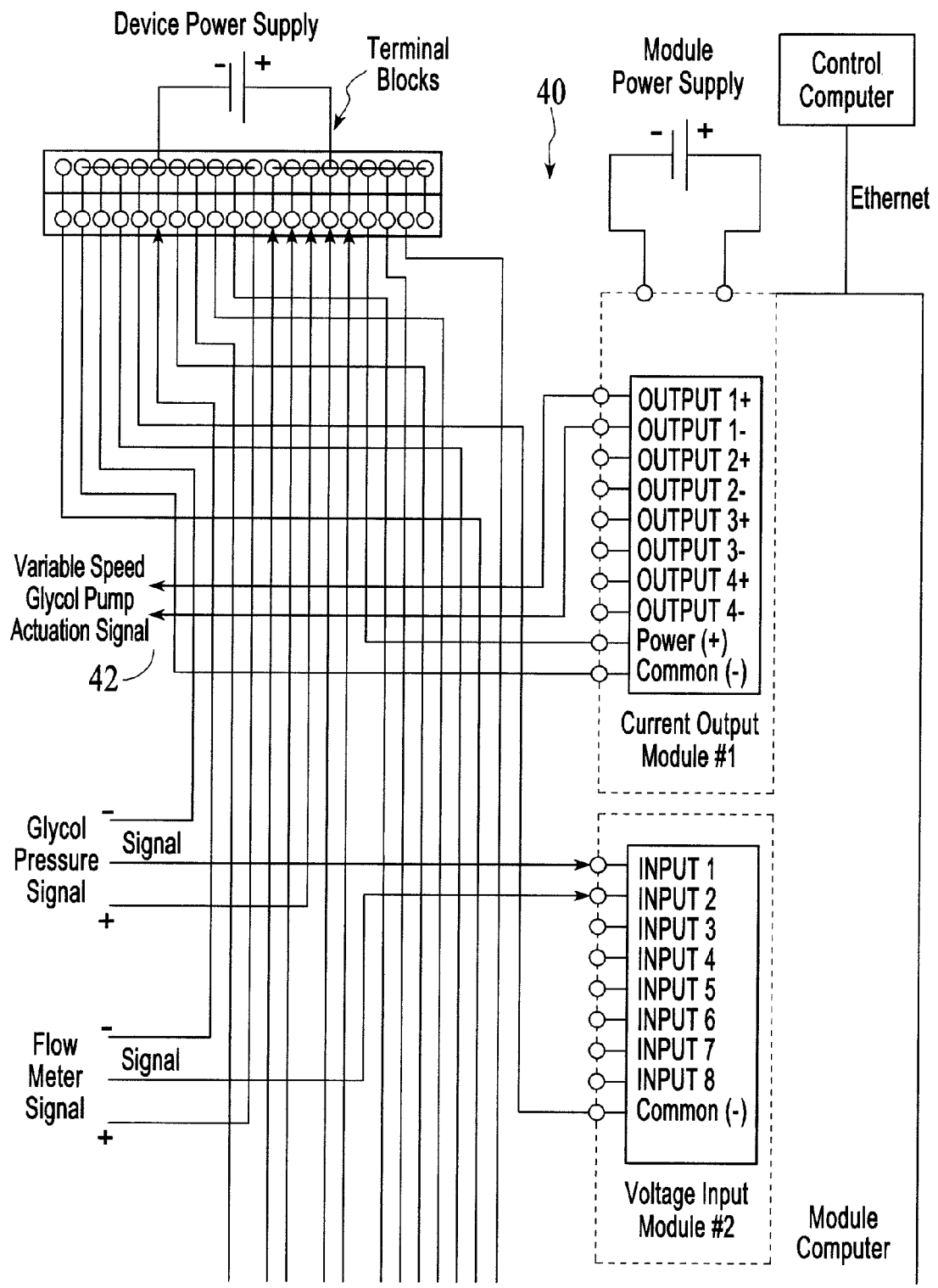
FIG. 2/1 (PRIOR ART)

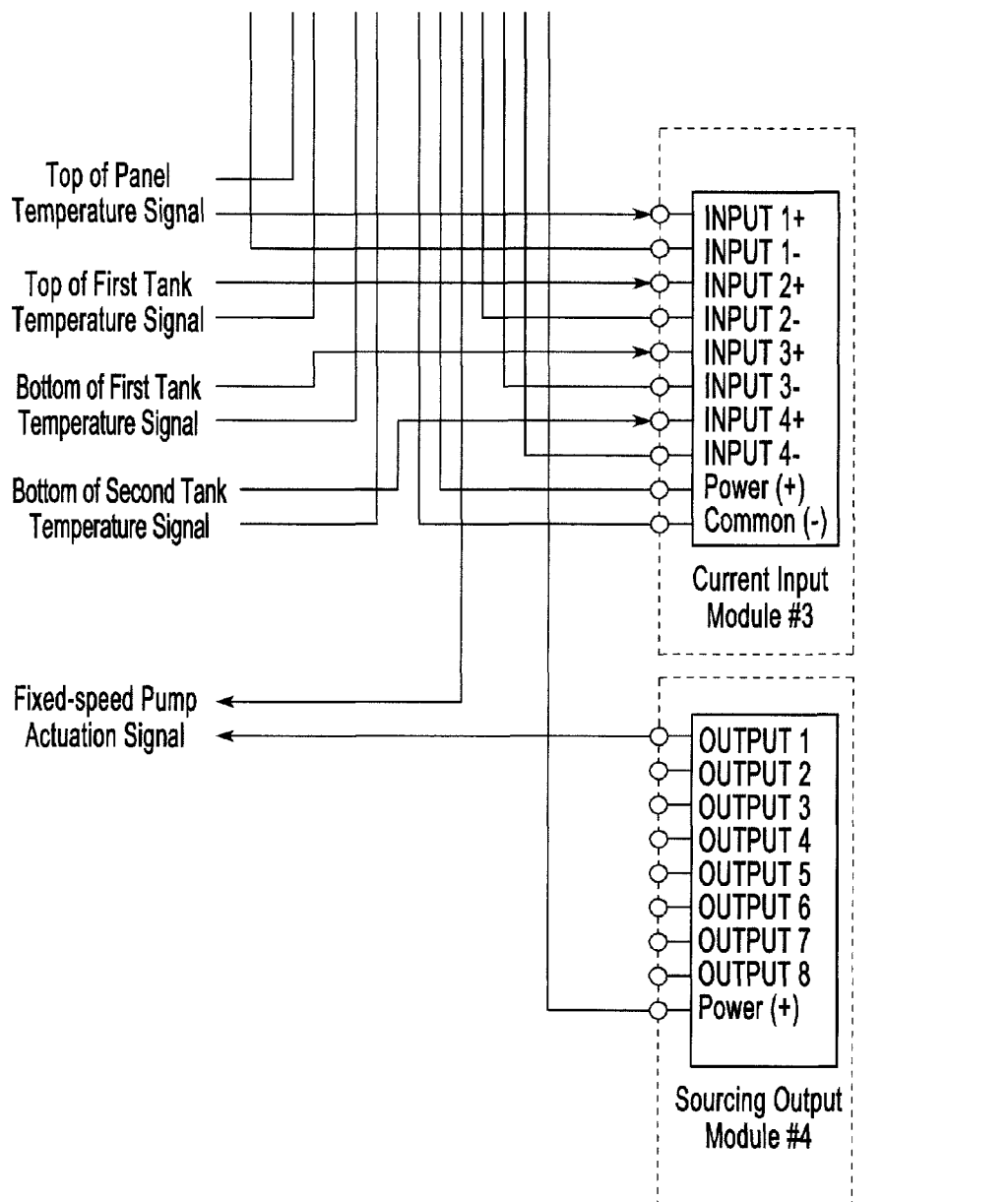
FIG. 2/2 (PRIOR ART)

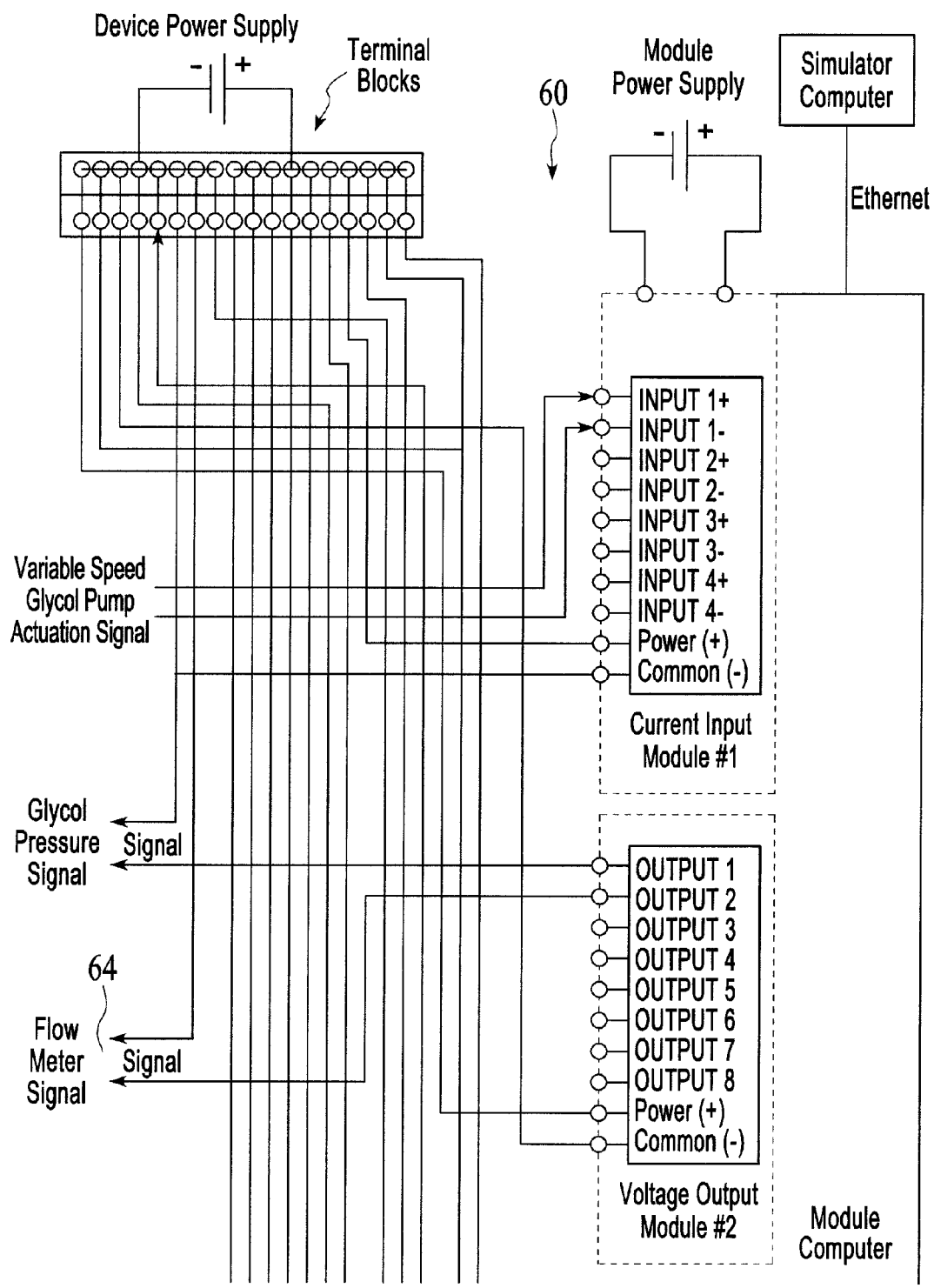
FIG. 3/1 (PRIOR ART)

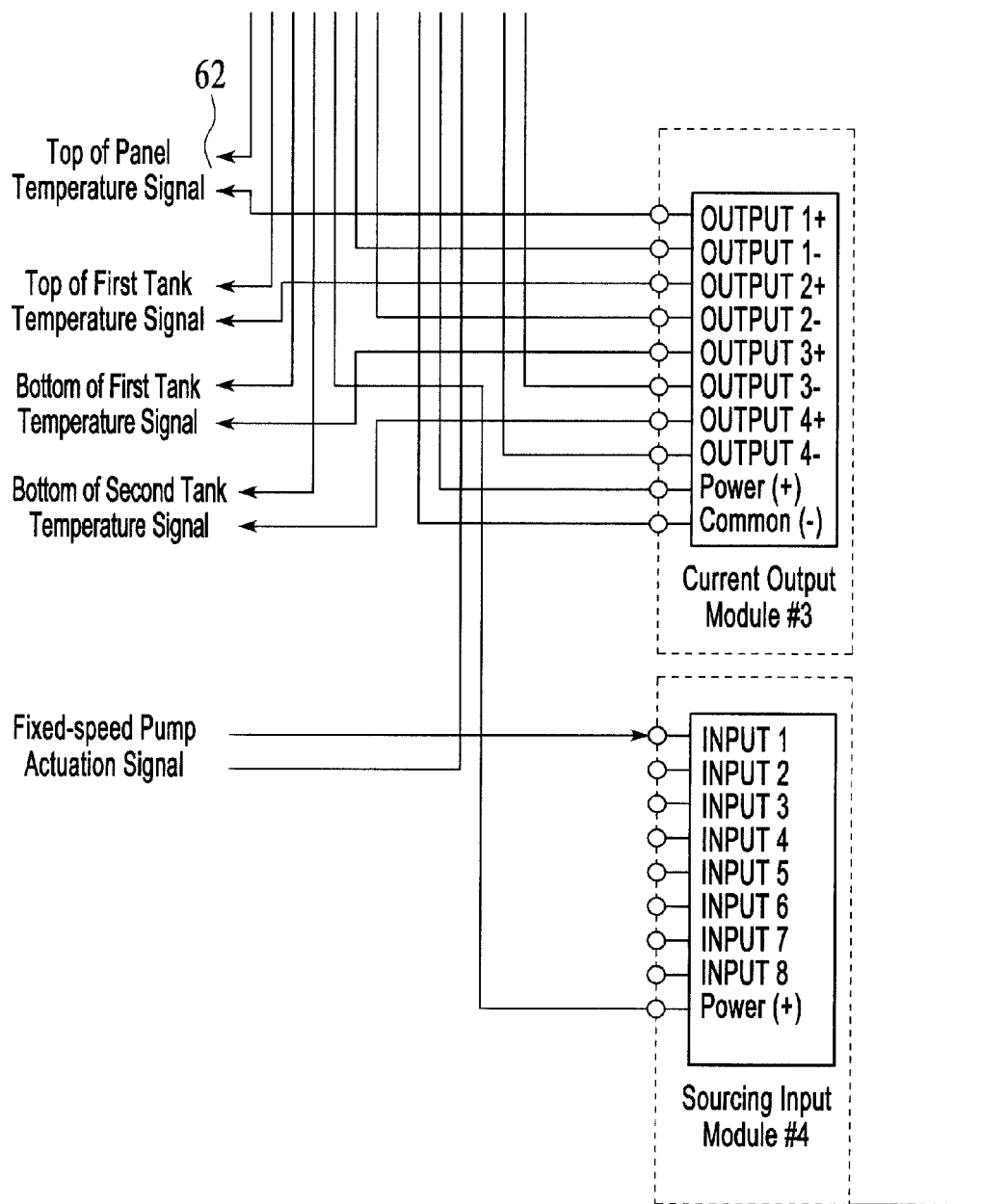
FIG. 3/2 (PRIOR ART)

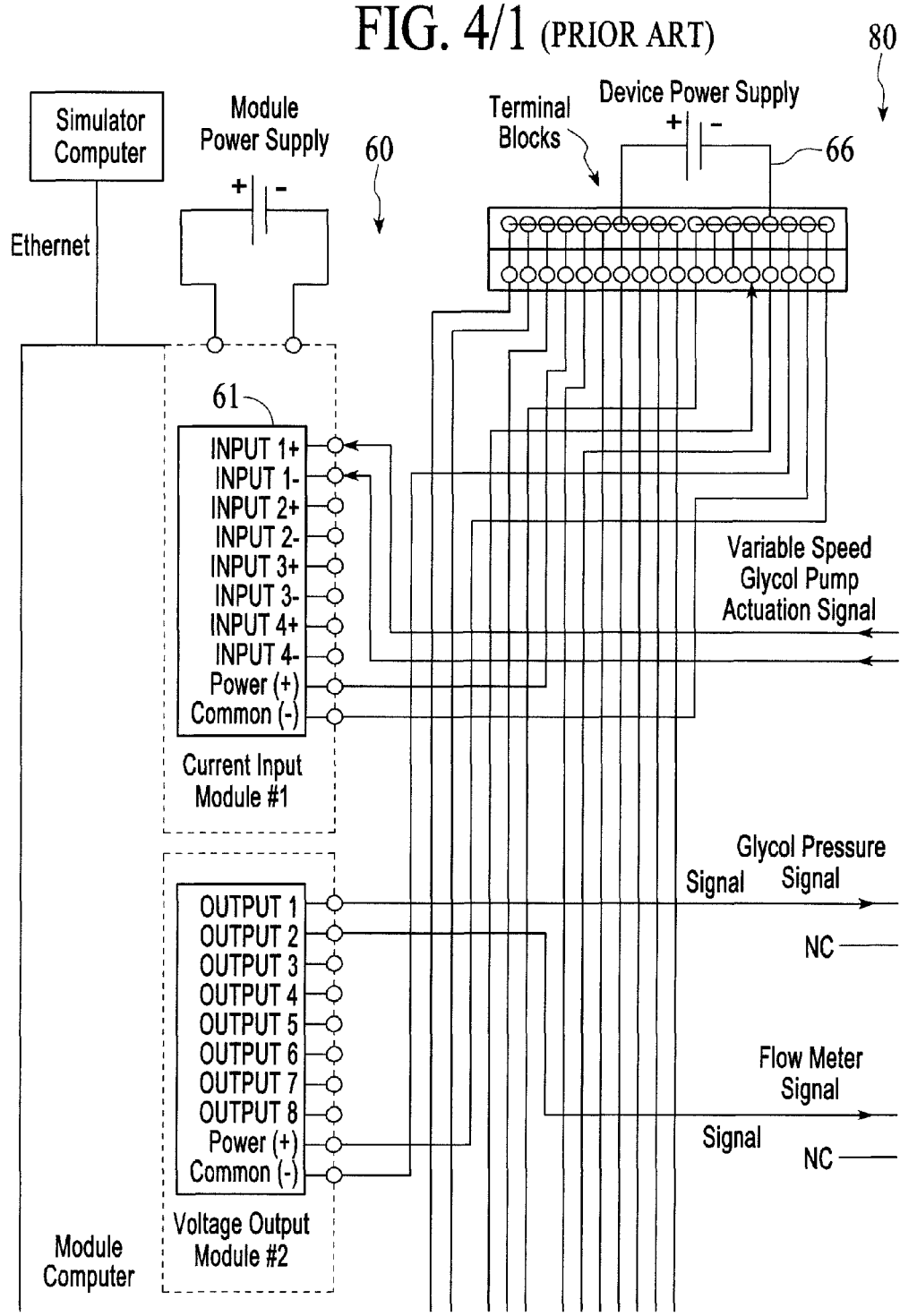
FIG. 4/1 (PRIOR ART)

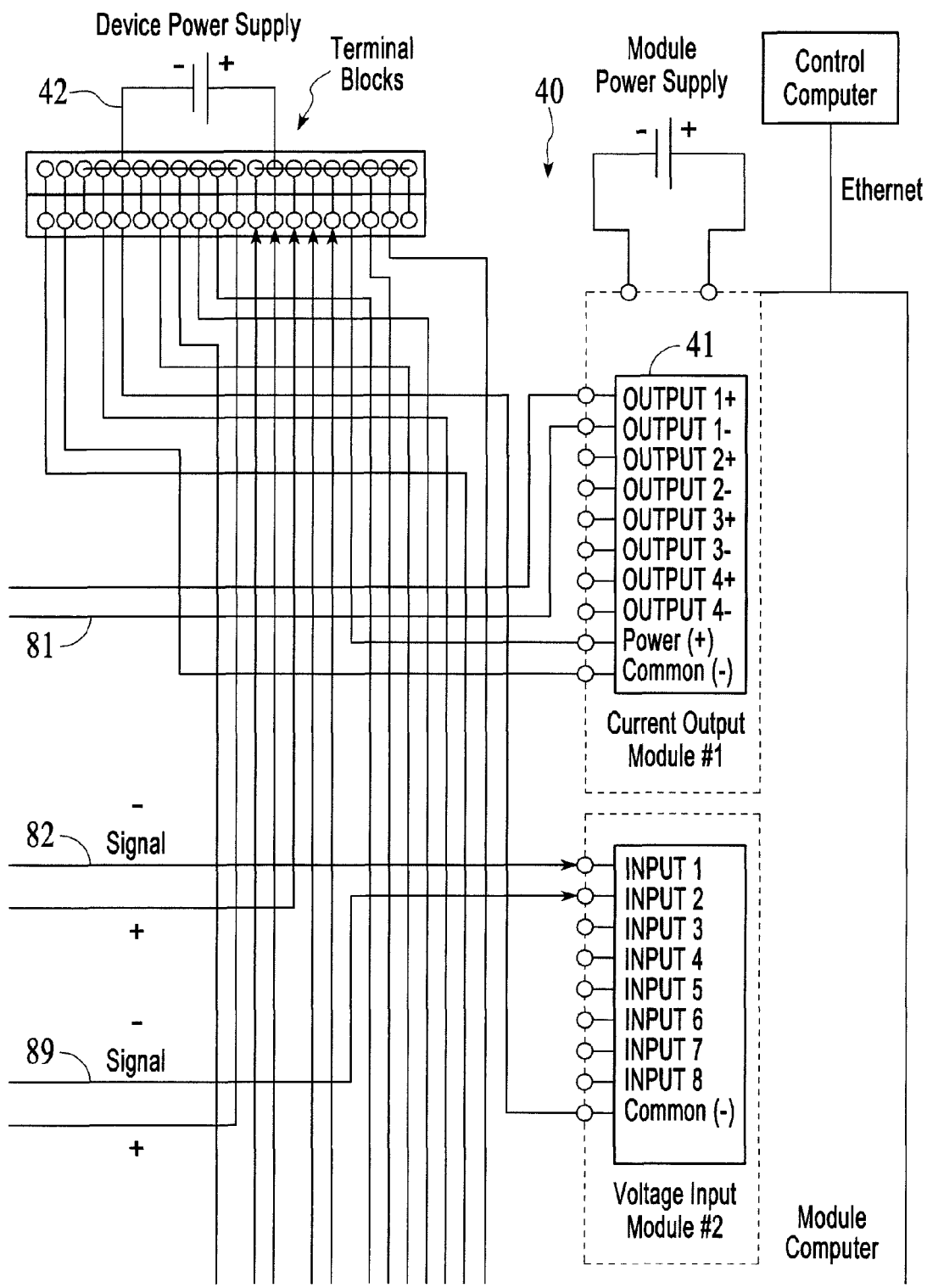
FIG. 4/2 (PRIOR ART)

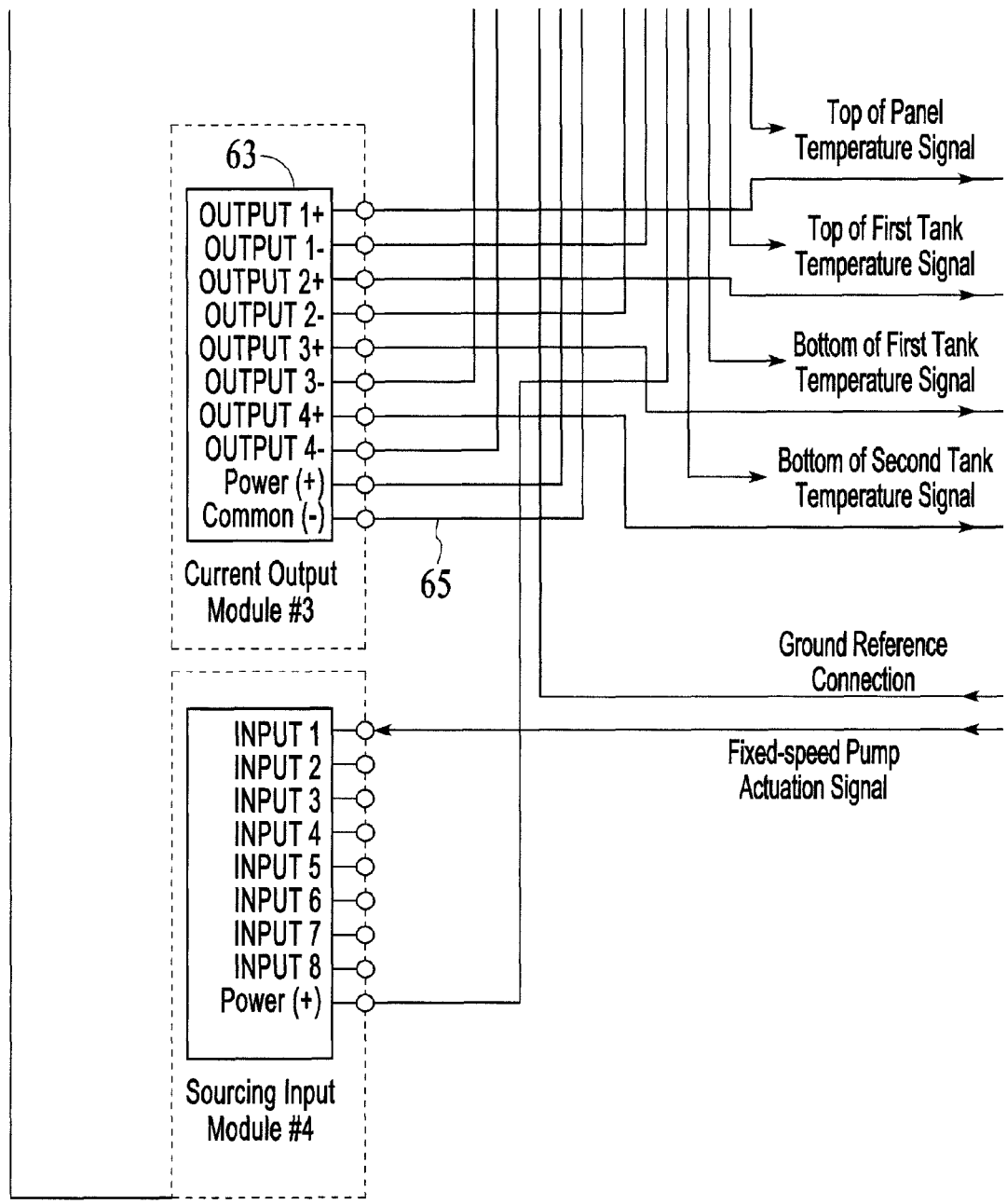
FIG. 4/3 (PRIOR ART)

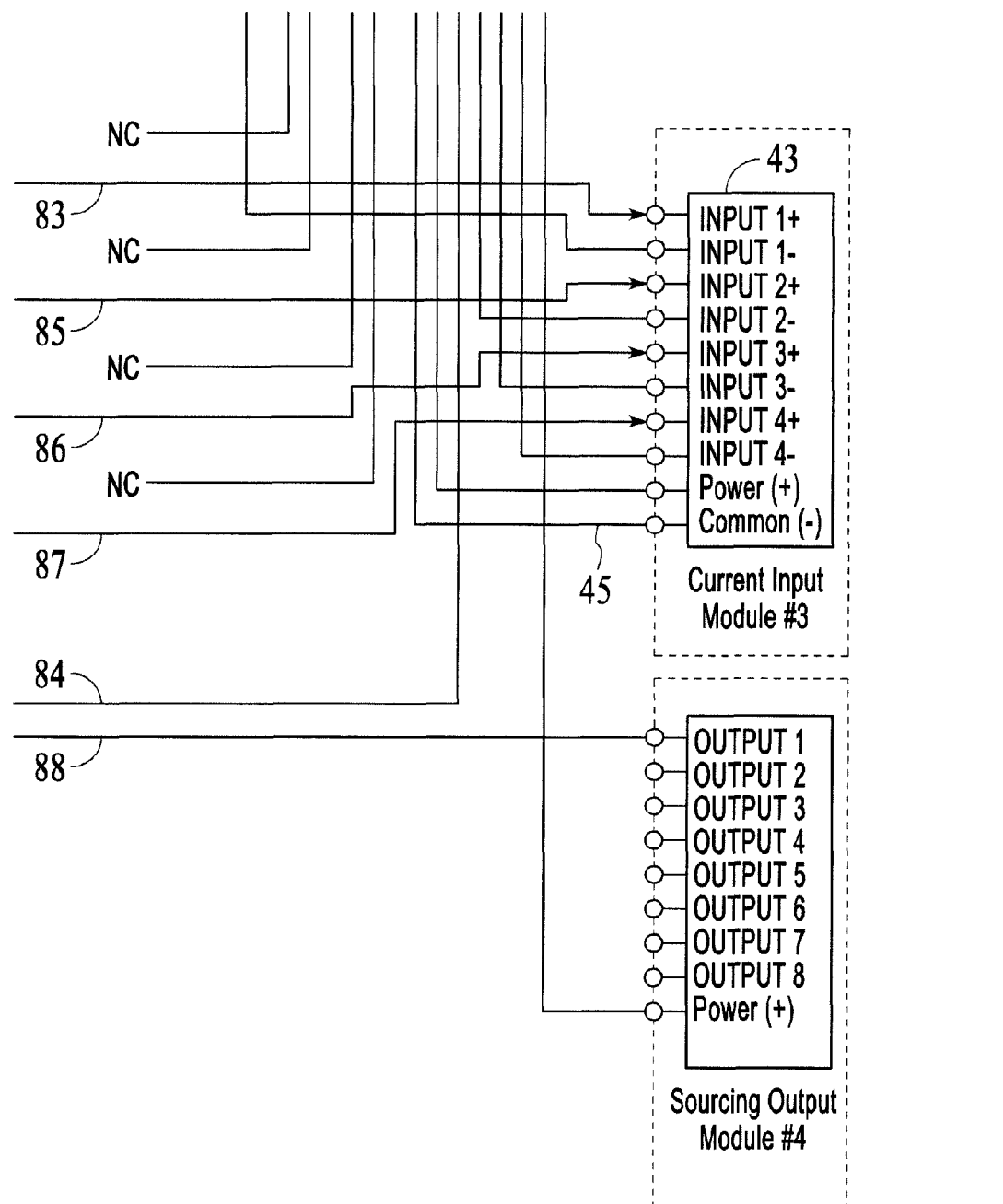
FIG. 4/4 (PRIOR ART)

| FIG. 5/1 | FIG. 5/2 |
|---|---|
| FIG. 5/3 | FIG. 5/4 |

FIG. 5

FIG. 5/1
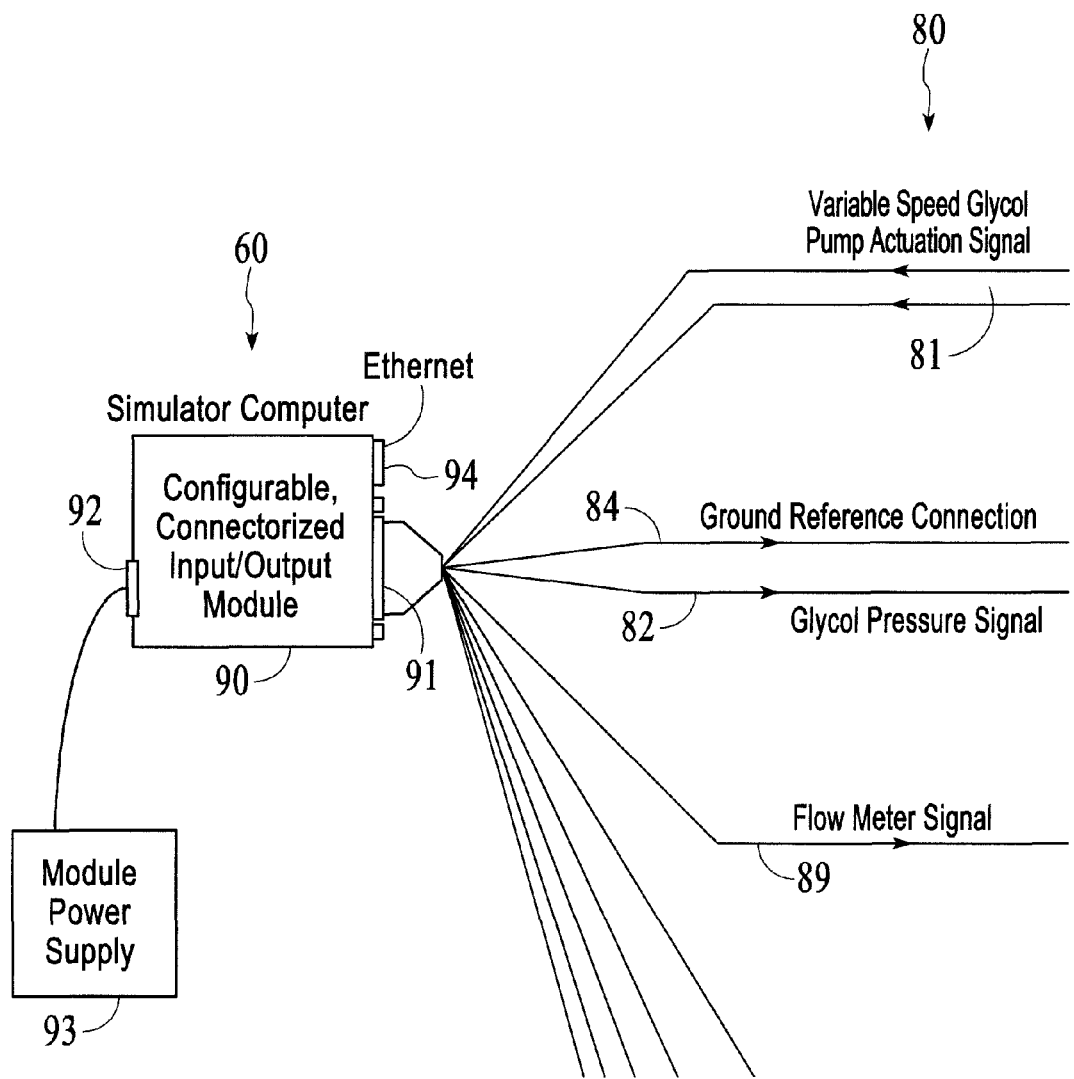

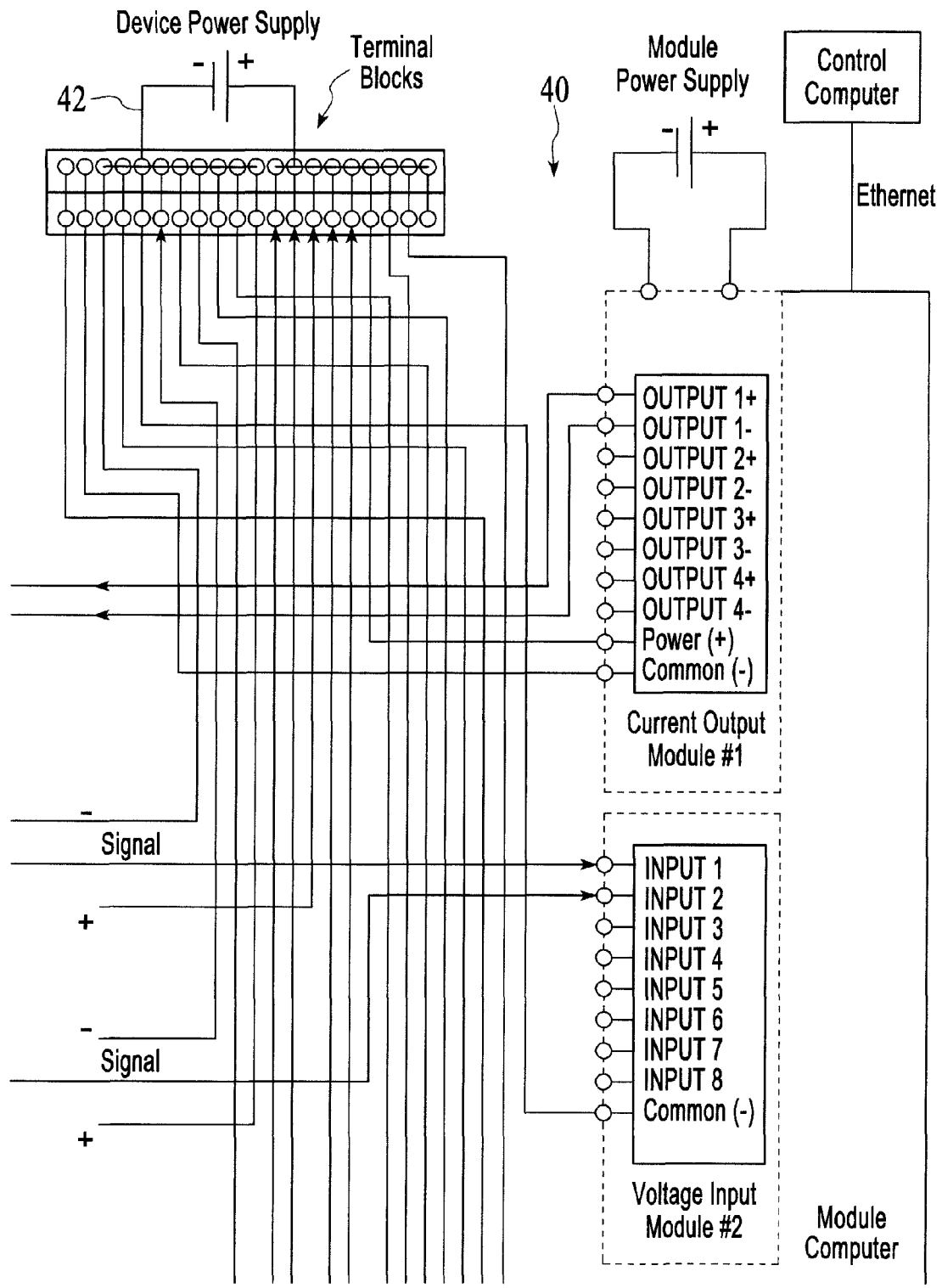
FIG. 5/2

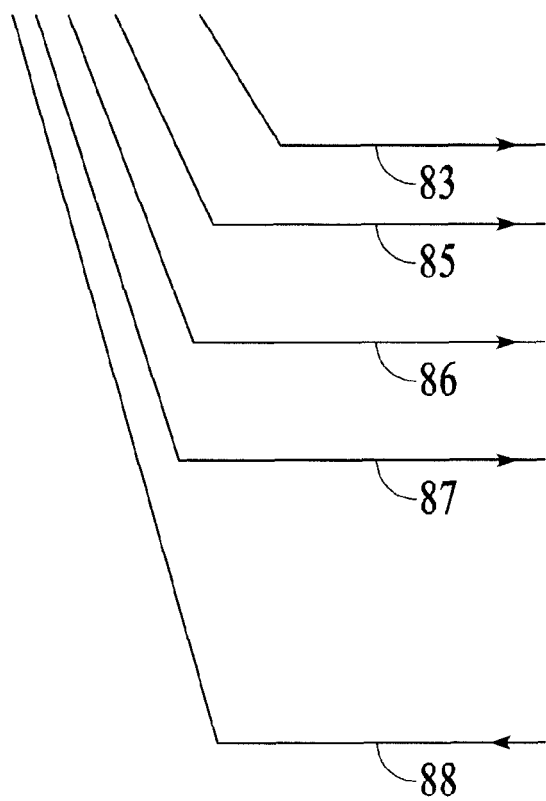
FIG. 5/3

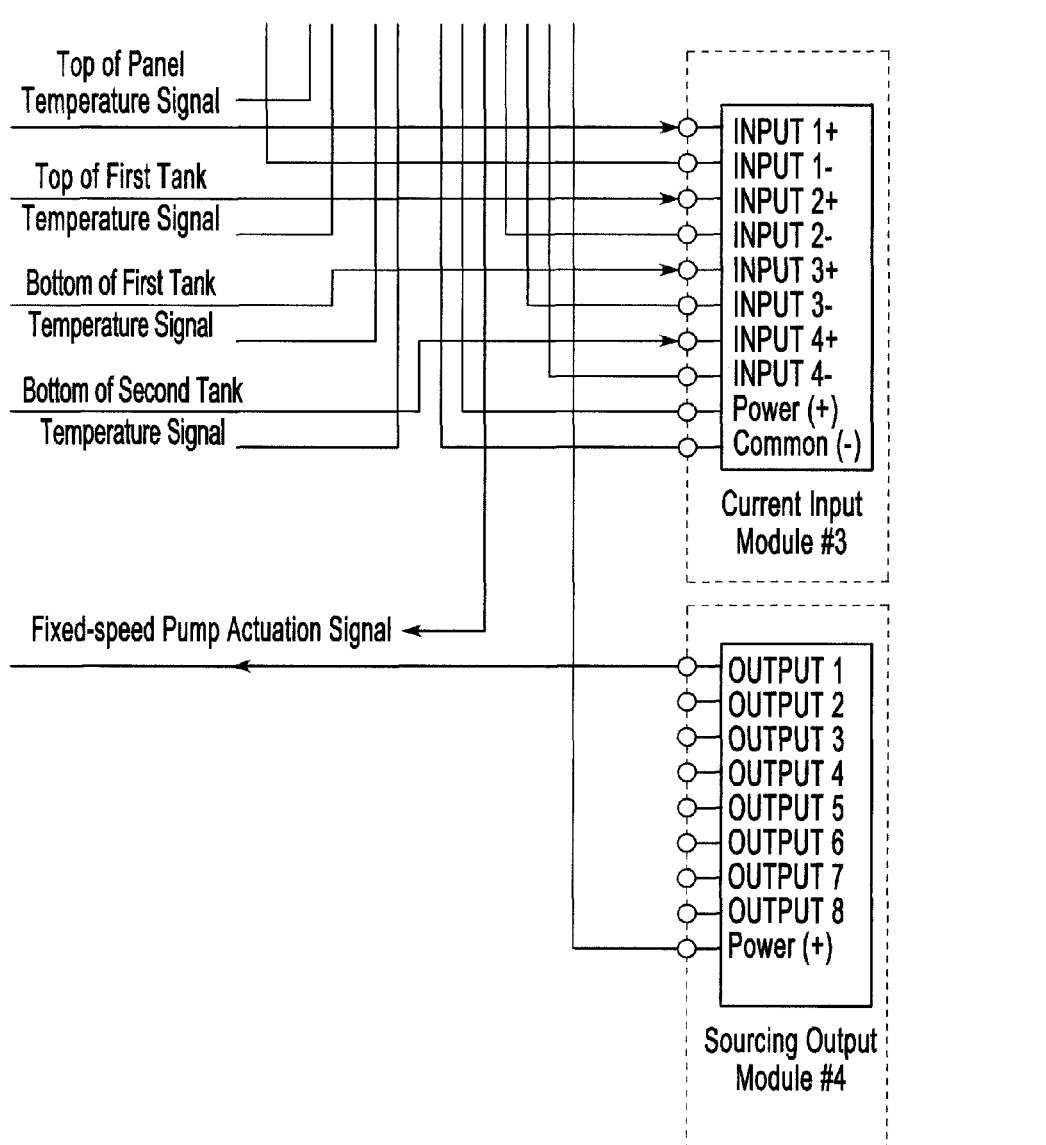
FIG. 5/4

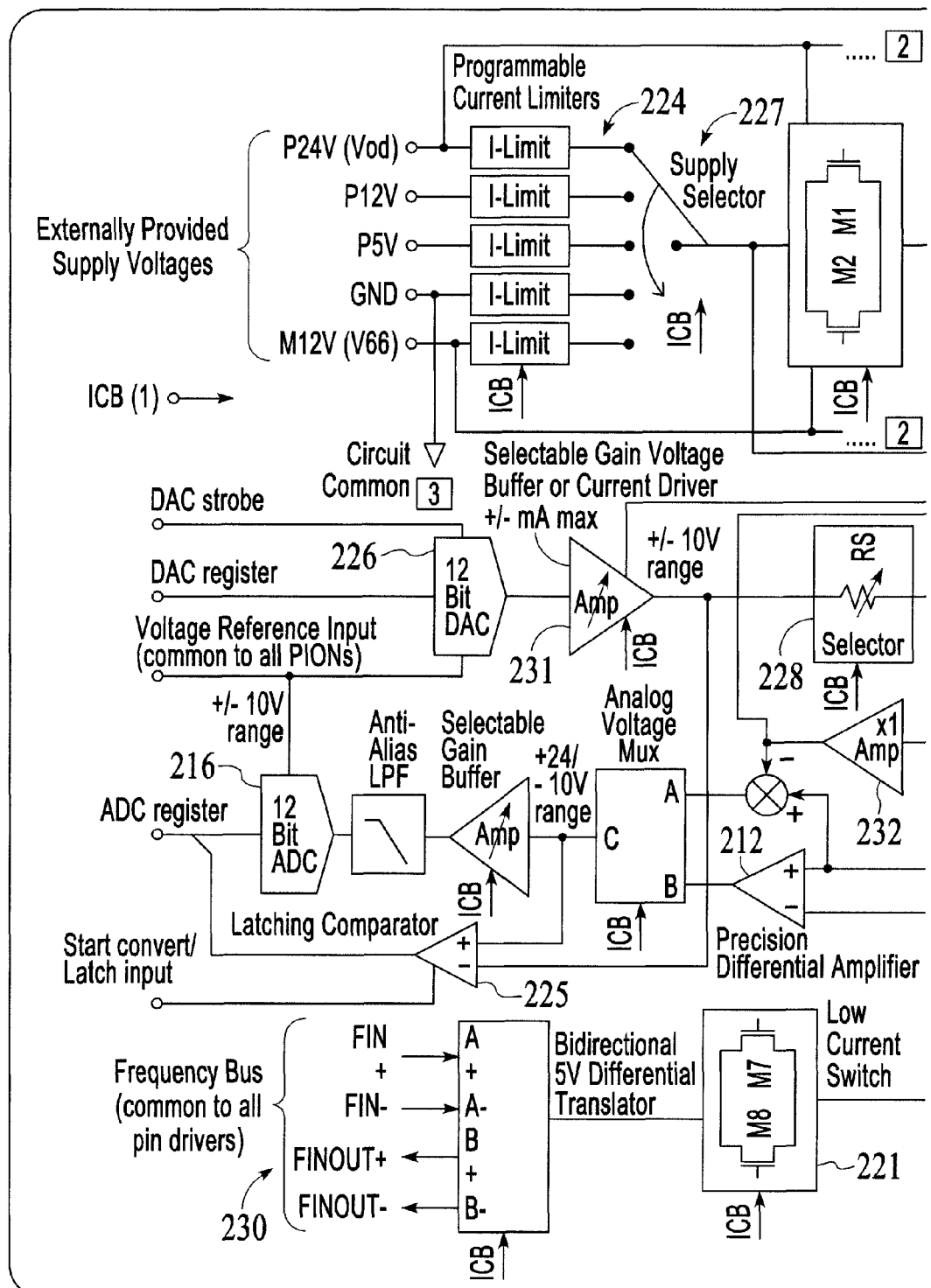
FIG. 11/1

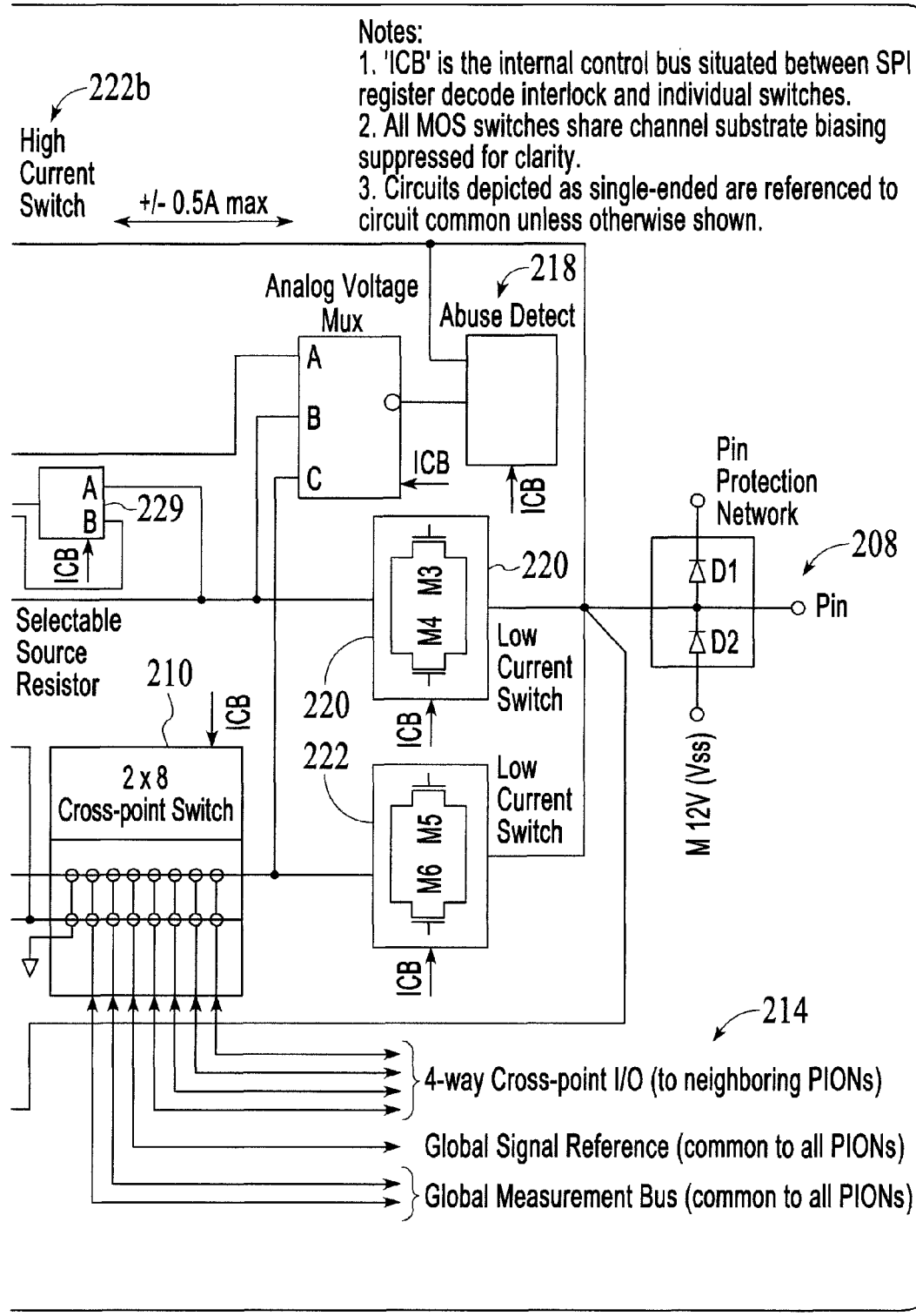
FIG. 11/2

CONTROL SYSTEM SIMULATOR AND SIMPLIFIED INTERCONNECTION CONTROL SYSTEM

RELATED APPLICATIONS

This application claims the benefit of U.S. Provisional Patent Application Ser. No. 61/316,070 filed Mar. 22, 2010, and is a continuation-in-part of U.S. patent application Ser. No. 12/911,445 filed Oct. 25, 2010, which is a continuation of U.S. patent application Ser. No. 12/106,968 filed Apr. 21, 2008 (now U.S. Pat. No. 7,822,896 and which claims the benefit of U.S. Provisional Application Ser. No. 60/950,040 filed Jul. 16, 2007), which is a continuation-in-part of U.S. patent application Ser. No. 11/801,127 filed May 7, 2007 (now abandoned), which is a continuation of U.S. patent application Ser. No. 11/296,134 filed Dec. 6, 2005 (now U.S. Pat. No. 7,216,191), which is a continuation-in-part of U.S. patent application Ser. No. 11/043,296 filed Jan. 25, 2005 (now abandoned), which is a continuation-in-part of U.S. patent application Ser. No. 10/071,870 filed Feb. 8, 2002 (now U.S. Pat. No. 6,892,265 and which claims the benefit of U.S. Provisional Application Ser. No. 60/269,129 filed Feb. 14, 2001). The foregoing disclosures are incorporated herein by reference.

FIELD OF THE INVENTION

This invention relates to computer simulators for physical processes ("process simulators" or "simulators"), and more specifically to improvements that result in simplification of wiring of simulators, reduction in the number of components required to implement a simulator, and reduction in the length of time for implementation. The types of processes to which it is applicable vary widely, including but not be limited to chemical, thermal, and mechanical processes.

BACKGROUND OF THE INVENTION

Computer simulations of physical processes are widely used in engineering systems in order to develop a new process or test and to perfect the operation of a computer-based control system. Thus, a manufacturer of a tool for processing silicon wafers can employ a simulator to exercise the tool control system in order to avoid the need to run the tool with actual product, which can save time and money in tool development and testing.

For example, if a complex semiconductor wafer-processing tool is designed to heat a silicon wafer under vacuum and then expose it to various gasses in order to produce a film coating, the control system must employ numerous sensors and actuators to achieve the process goal. Thus, the control system might actuate valves to isolate the process chamber, actuate a pump to evacuate the chamber and then sense the level of vacuum before actuating the heating system such that the wafer is carefully heated to a precise temperature. Once the wafer is at an initial process temperature, the tool control system might actuate one or more mass flow controllers, thereby introducing a precise mixture of reactive gasses. Then the control system might actuate a power supply to produce a plasma that will enhance the gas reaction and ultimately produce a film on the wafer. At the end of the process, the tool control system might turn off the plasma, shut off the mass flow controllers, close the valves, turn off the heaters and allow the wafer to cool and again reach atmospheric pressure in order to then transfer the wafer to the next step in the complex semiconductor process.

To perfect the complex process described above, the semiconductor tool designer must assemble hardware and write software to sequence the tool through the steps of the process. To reduce waste of valuable wafers and avoid unintended consequences when using toxic gasses and potentially dangerous electrical energy, the tool builder will attempt to simulate the physical process using a number of strategies.

A simple strategy employed to simulate the physical process is to embed within the control system software program subroutines that mimic or simulate the action or result that would occur if actual sensors and actuators were employed. For example, a control system statement to turn on a heater might activate a software subroutine that would begin integrating heater energy and estimate the current temperature. This temperature estimate would then be substituted for the measured temperature when the control system desires to read the value of process temperature from a temperature sensor. The control system software would therefore employ the simulated temperature to make decisions about whether the wafer process was under control. Such a simple simulation is commonly used but suffers from several limitations. First, the control system software must be modified in order to bypass the actual sensors and actuators. The actual software is therefore not tested, but rather a modified version of the software is tested. Second, the simulated value might not be a good representation of the physical value. Real sensors convert physical properties—such as temperature or pressure— to electrical signals. These electrical signals are then converted by the control system to digital representations mimicked by the simulator. If the simulated value produced by the simple embedded software strategy described above is not representative of the electrical signal generated by the sensor, the action of the control system might not be representative of its action in non-simulated operation. For example, the simulated digital representations might have more or less numeric precision, or the dynamics or timing of the volumes might differ. Thus, this simple modified software simulation strategy of embedding software into the control system suffers from significant limitations.

A more complex but effective strategy employed to simulate a physical process is to employ a second computer that is capable of sensing actuation signals produced by the tool control system and then producing actuation signals that can be sensed by the tool control system. In operation, if the tool control system actuates the heater, an electrical signal is routed to the simulator computer rather than the heater. The simulator computer senses the actuation signal to the heater and responds by integrating the amount of heat in the system and then perhaps gradually increasing or decreasing its output electrical signal which mimics the electrical signal produced by the temperature sensor. The tool control system senses this electrical signal which it cannot distinguish from the electrical signal produced by the temperature sensor. If the simulator system is properly designed, the tool control system will function precisely as it would if the simulator computer had not been employed to bypass the heater actuator and the temperature sensor. Such a computer-based simulator which is separate from the tool control system can allow the tool control system to be developed, tested and perfected without the need to employ the physical process. Because the tool control software need not be modified in order to run the actual process, the step of moving from simulated process to actual process can be expected to go more smoothly.

The prior art strategy of employing a second computer to simulate the process, although effective, is itself complex and expensive because the complexity of the simulator is roughly equal to the complexity of the tool control system. In addition, the second simulator computer must be electrically connected to the tool control system, and the connections are complex, error prone and time consuming.

SUMMARY OF THE INVENTION

The present invention provides a computer-based simulator that is separate from the computer control system. The invention simplifies the electrical interconnection of the computer-based simulator to the computer control system and reduces the number of hardware components required to effect a computer-based simulator. The invention also facilitates remote configuration and operation of the control and simulator systems.

BRIEF DESCRIPTION OF THE DRAWINGS

FIG. 2 illustrates a prior art control system for controlling a solar hot water system.

FIG. 3 illustrates a prior art simulation computer with an input/output system capable of simulating the operation of a solar hot water system.

Figure 5:
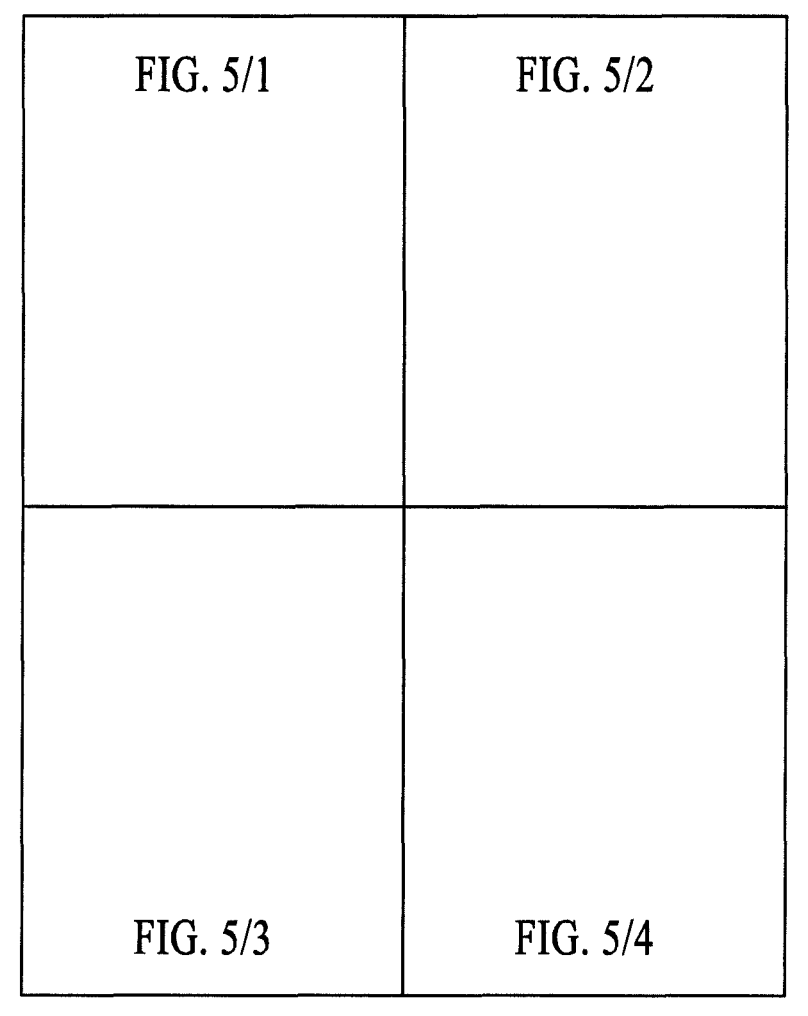

FIG. 5 illustrates a configurable, connectorized input/output module of the present invention configured as a simulation computer with input/output system connected to a control system, where the combination simulates the operation of a solar hot water system.

FIG. 11 is a schematic of an integrated circuit performing the function of the configurable interface apparatus of the invention.

DETAILED DESCRIPTION

In U.S. Pat. Nos. 6,892,265, 7,216,191 and 7,822,896, a method and apparatus is described which provides for a configurable, connectorized module to be employed to effect an input/output and control system capable of interfacing to sensors and actuators. Such a module can perform the functions of an input/output system or a control system, using sensor information to compute actuation signals which are then connected to actuators. Modules built using the teaching of these inventions have been employed as input/output systems for control systems or as a control system for a variety of processes. Thus, temperature sensors may be electrically connected to the module and heater actuation signals may be connected electrically to a heater system. Such modules have demonstrated the ability to reduce the number of components required to build a control system while significantly reducing the complexity of the interconnection wiring.

Although a simulator computer functions in a very different manner than a control computer, both computers must connect electrically in order to sense and actuate. However, whereas the control computer electrically connects to sensors and actuators, the simulator computer electrically connects to the control computer during the simulation phase of control system development. The present invention uses a configurable, connectorized module employed to take a role in realizing a simulation system, thus benefiting from the advantages of the patents cited above.

In order to describe how a configurable connectorized module can function in the role of a simulator, we will describe a relatively simple solar hot water heating system. The solar hot water system will consist of a controller interfacing to various sensors and actuators. We will then describe how a simulator may be realized that practices the teaching of the present invention, thereby reducing development time and simplifying wiring. It is not an object of this document to describe how a simulator functions but rather how a simulator employing the teaching of the present invention can simplify the interconnection to a control system. Those skilled in the art will understand the function of a simulator.

1. Solar Hot Water System Example

Figure 1:
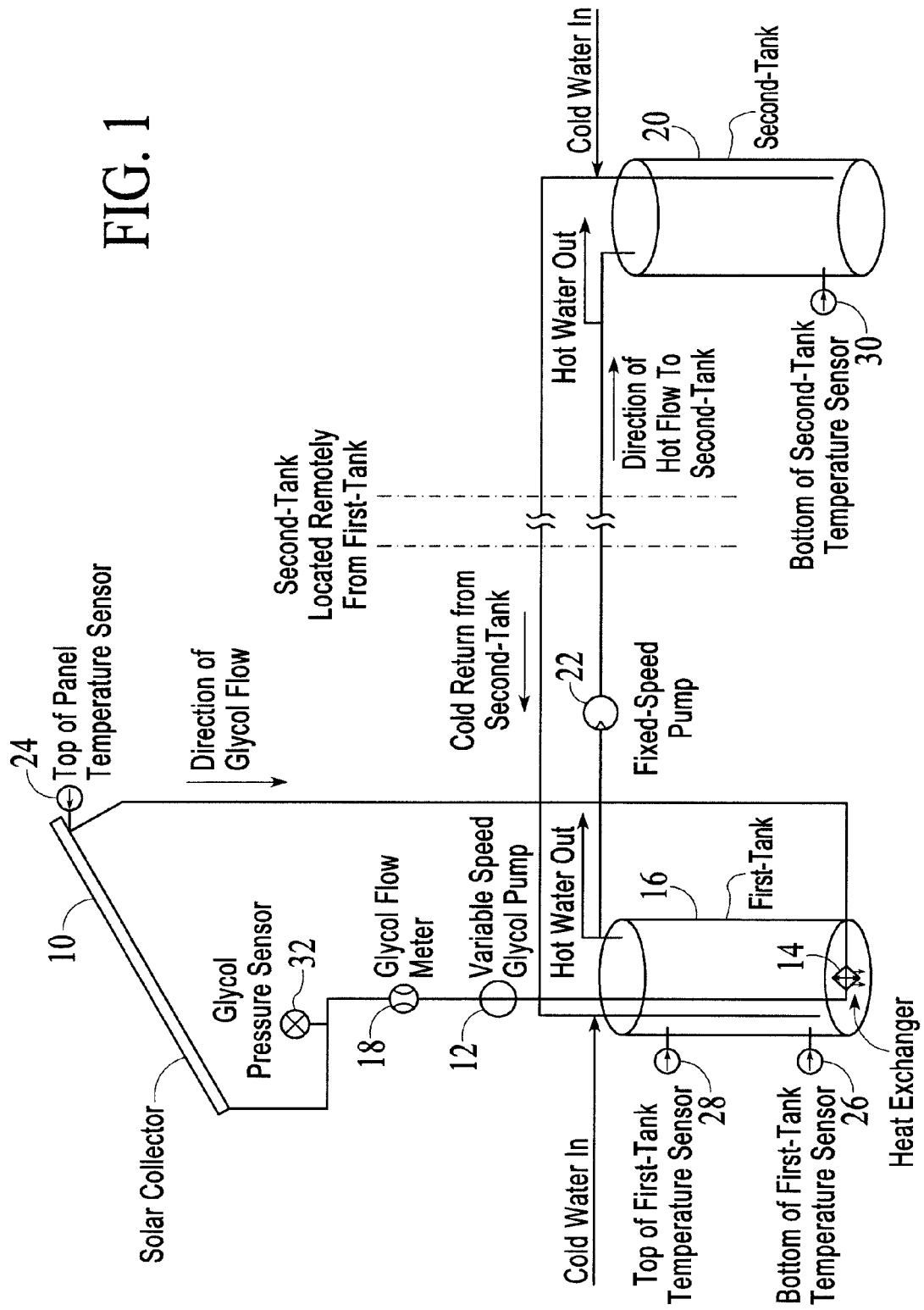
FIG. 1 illustrates a solar hot water system that demonstrates benefits of the present invention.

We now describe a solar hot water system as might be found in an industrial or home setting by referring to FIG. 1. A solar collector 10 is located such that it receives solar exposure during some part of the daylight hours. A variable speed pump 12 causes a heat transfer fluid such as propylene glycol to be circulated through the panel and thence through a heat exchanger 14 in a first tank 16 such that fluid returning from the panel is sufficiently hotter than the temperature at the bottom of the first tank, so that the amount of heat transferred to the first tank is (at a minimum) greater than the energy required to run the pump to effect the heat transfer. A flow meter 18 measures the mass flow rate of propylene glycol in order to calculate and then display heat flow as will be subsequently explained. As hot water is withdrawn from the top of the first tank, cold water enters the bottom of the first tank and is subsequently heated by the heat exchanger, thus effecting solar heating of the water.

In order to make the need for a simulator more obvious, we slightly increase the complexity of the system by adding a second tank 20 and fixed-speed pump 22, which can transfer water from first tank 16 to second tank 20.

Temperature sensors connected to the solar hot water system can measure the top-of-panel temperature 24, bottom-of-first-tank temperature 26, top-of-first-tank temperature 28, and bottom-of-second-tank temperature 30.

Our example solar hot water system also includes a pressure transducer 32 to monitor the pressure of the closed-circuit propylene glycol. Too high a pressure can indicate that the glycol is at risk of boiling, thus the variable speed pump should be turned on to cool the panels. On the other hand, too low a pressure during normal operation could indicate a leak in the system, requiring an alarm condition.

Referring now to FIG. 2, in operation, a controller 40 constantly measures all four temperatures and constantly evaluates the following logic statements:

IF ((top-of-panel temperature) MINUS (bottom-of-first-tank temperature) is GREATER THAN 10 C) AND (top-of-first-tank temperature) is LESS THAN 70 C THEN (TURN ON variable-speed pump).

IF (bottom-of-first-tank temperature) is GREATER THAN 50 C) AND ((top-of-panel temperature) MINUS (bottom-of-first-tank temperature) is GREATER THAN 10 C) AND (bottom-of-second-tank temperature) is LESS THAN 45 C THEN (TURN ON fixed-speed pump for 8 minutes).

The first logic statement above will cause the variable-speed pump to be started if the sun-heated panel is 10 C hotter than the bottom of the first tank and the first tank is not too hot (as it could possibly boil).

The second logic statement above will cause hot water from the first tank to be pumped to the second tank if the first tank is warmer than the second tank and the second tank is not already too hot. The fixed-speed pump is run for a period of 8 minutes because shortly after the fixed-speed pump starts, cold water from the second tank will cool the bottom of the first tank, thus violating the second logic statement. In other words, the second logic statement will cause a fixed volume of water to be exchanged between the first tank and second tank, thus transferring solar-heated water to the second tank.

Finally, the controller will constantly measure the mass flow rate of propylene glycol pumped and then multiply the mass flow rate by the difference in temperature between the top-of-panel temperature and the bottom-of-first-tank temperature. The multiplication results in a measure of heat pumped per unit time. The controller then executes a common hill-finding algorithm where the variable-speed pump is slightly increased in speed or decreased in speed in order to maximize the total heat pumped over the time that the variable-speed pump operates.

With the basic control system now described, the need for a simulator may now be described.

2. Need for a Simulator

Simulators prove invaluable in perfecting systems before they are deployed. Simulation is extensively used for new aircraft and space vehicles because in-situ testing is often impossible and the cost of failure is high. We have intentionally made the solar hot water system example sufficiently complex that without a simulation phase, much time consuming testing and re-work would be required in the field. In order to test such a solar system over many solar cycles, many days in the field are required. We have introduced the hill-finding algorithm to maximize heat transfer. Such algorithms are especially valuable when the problem is made up of multiple variables and an explicit solution is difficult to specify. In the case of the solar hot water system, the solution to the problem of what speed to run the pump is not easily computed using brute force. For example, increasing the speed of the variable-speed pump will increase mass flow and briefly increase heat transfer rate. However, increasing mass flow rate will often reduce the temperature of the glycol exiting the solar panel, thus the mathematical product of mass flow rate times temperature difference may increase or decrease. Specifically, decreasing the difference in temperature across the solar panel can result in more efficient heat transfer, thus the reduction in temperature with increased variable-speed pump speed may result in a greater heat flow rate. At the same time, this relationship is itself a function of solar radiation (that is time of day and time of year) as well as the temperature of the first tank. The hill-finding algorithm can find the best variable speed pump flow rate under the circumstances if it is designed correctly. The design can include changes to the algorithm or its parameters. This design can be time consuming when performed in the field with an actual solar system. The use of a simulator can significantly reduce the design time.

Some operating modes of a system are difficult to test without a simulator. For example, our solar hot water system utilizes a pressure transducer to monitor glycol pressure. Too high or too low a pressure can indicate abnormal conditions, as described above. A simulator can easily cause such a condition to occur during normal operation, whereas forcing such a condition during actual operation might be difficult or even dangerous.

A simulation of the solar system can therefore significantly reduce the time and effort required to perfect the operation of the solar hot water control system. We point out that this need is far from unique to this problem: It is a pervasive need for many types of processes, yet, as described earlier, simulators tend to be complex, expensive and difficult to wire into the control system. We will now describe how the present invention reduces the cost, wiring difficulty and complexity of prior art approaches. We will first describe the complexity of the prior art and then contrast that complexity to the simplicity of the present invention.

Finally, we will describe a secondary benefit of the new simulator architecture that eliminates the need for the control system developer to be in physical possession of the controller or simulator hardware: We will describe the basis for a model that provides for utilizing remotely-located hardware, thereby reducing hardware purchases, set-up time, and consequently, planning for manufacturing of the completed control system.

3. Description of the Solar Hot Water Simulator

Although this description is of a simulator for our example solar hot water system, this description is intended to be applicable to the general need for control system simulators. Referring to FIG. 3, we schematically show a simulator 60.

Although the description of the present invention refers to a control system simulator computer that is preferentially contained inside a configurable, connectorized module, there is nothing in this description that prevents the control system simulator computer from being connected to the configurable, connectorized module, where the module only provides for the electrical connections representative of a control system simulator. Alternatively, a portion of the system simulator may be placed in the configurable connectorized module while the balance of the simulator is placed in a computer separate from the configurable connectorized module but connected nonetheless. For example, a readily available simulation language might be employed that executes on a computer workstation. The workstation is then connected to the configurable, connectorized module. The combination of workstation computer and configurable, connectorized module constitutes the control system simulator.

Figure 4:
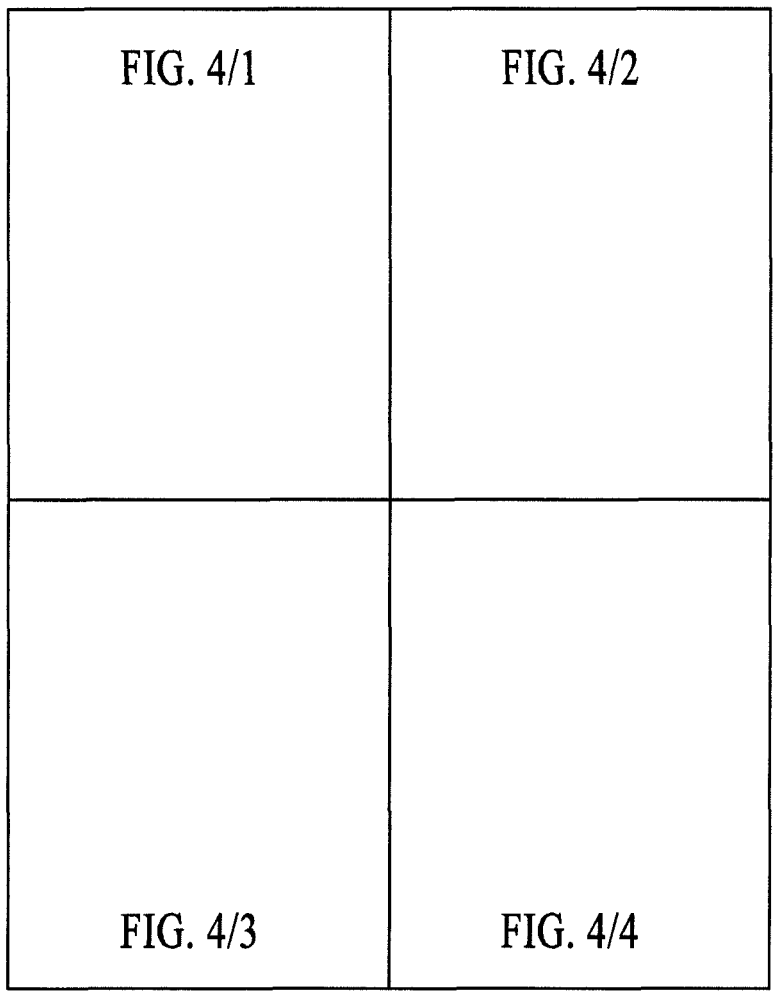
FIG. 4 illustrates a prior art simulated solar hot water system including a prior art control system and a prior art simulation system.

In order to simulate the solar system, the control system 40 of FIG. 2 is electrically disconnected from all sensors and actuators. The control system simulator 60 of FIG. 3 is then electrically connected to the control system 40. Referring to FIG. 4, the interconnected solar hot water control system and simulator system 80 is shown, being simply the interconnection of the control system 40 and the simulator 60. The control system simulator 60 must electrically sense outputs of the control system 40 and the control system simulator 60 must produce electrical actuation signals which are sensed by the control system 40. Thus for each temperature measurement sensor input to the control system, 24, 26, 28 and 30 of FIG. 1, a corresponding simulated temperature sensor electrical signal is produced by the control system simulator, and that electrical signal is electrically connected to the control computer. Therefore, the control system simulator can cause an electrical signal to be processed by the control system computer such that the control system measures the desired simulated temperature.

In an analogous manner, the control system 40 is electrically connected to the control system simulator 60, such that actuation outputs a simulation of the control system are sensed by the control system simulator. Thus, referring to a simulation of the configuration of FIG. 1, when the control system turns on the fixed-speed pump 22, the electrical output of the control system computer is electrically sensed by the control system simulator, and the control system simulator can then take the appropriate action. In the case of the variable-speed pump 12, the output of the control system computer is a continuously varying signal, such as a common 4 to 20 mA signal. This control system actuation signal is sensed by the control system simulator and the simulator then responds appropriately to this signal from the control system computer. The appropriate response includes causing the simulator to produce an electrical signal representative of the mass flow rate sensor 18. Sometimes, the flow rate sensor might produce a series of electrical pulses, the frequency of pulses being proportional to flow rate. In this example, as is common for simple flow meters which generate a voltage proportional to flow rate, the control system simulator is capable of generating a voltage which precisely represents the flow of propylene glycol. For the system thus far described, the flow rate of propylene glycol is proportional to the speed of the variable-speed pump.

The appropriate response by the control system simulator would also include causing the measured temperature at the top of the solar panel 10 to register a lower value and the measured temperature at the bottom of first tank 16 to register a higher value representative of hot glycol being pumped out of the solar panel 10 and into the heat exchanger 14 inside first tank 16.

4. Operation of the Solar Hot Water Simulator

In operation, the control system simulator 60 is electrically connected to the control system computer 40. The control system simulator 60 sets its outputs to appropriate initial conditions as defined by the user of the simulator. In this case, for example, the top-of-panel temperature 24 might be set to a pre-dawn temperature of 20 C, with the bottom-of-first-tank temperature 26 set to a representative pre-dawn temperature of 30 C. The top-of-first-tank temperature 28 might be 40 C, indicative of a pre-dawn first tank temperature. The bottom-of second-tank temperature 30 might be 30 C also representative of a pre-dawn temperature.

Because the control system computer 40 is electrically connected to the control system simulator 60, the control system computer will electrically sense these simulated temperatures. Based upon these initial conditions, the control system computer evaluates the earlier described logic statements and sets its output actuation signals in order to turn off both the variable-speed pump 12 and the fixed-speed pump 22. The control system 40 is thus in an idle state waiting for solar energy to arrive as the sun rises.

For this type of control system simulation, a common strategy would be to simulate the sunrise. The control system simulator computer 60 as shown in FIG. 4 would gradually increase its top-of-panel temperature actuation signal 83, representative of a gradual heating of the solar panel 10. The rate of heating is specified in the control system simulator program as is customary for any simulator.

The control system computer 40 will sense the increase in top-of-panel temperature actuation signal 83. At some point, the first logic statement will be true as the difference between the bottom-of-first-tank temperature 26 and top-of-panel temperature 24 exceeds 10 C. At this point, the control system computer 40 will turn on the variable-speed pump output 42 via signal 81 and set it to an initial speed.

The control system simulator 60 is electrically connected to the variable speed pump actuation signal 81 produced by the control system computer. In response to the signal from the control system to turn on the variable-speed pump, the control system simulator will do two things as specified by its internal program. First, it will begin producing a voltage on its simulated flow meter output signal 89 that is proportional to the set speed of the variable speed pump, thereby simulating the output of the glycol mass flow meter. Second, the control system simulator will begin computing the changes to the other temperatures that would result given the speed of the variable-speed pump set by the control system 40. For example, the bottom of first tank temperature 26 and the top-of-first-tank temperature 28 will begin to increase given flow of hot propylene glycol into the heat exchanger 14 in first tank 16. The amount of change to the temperature is a function of both the variable pump flow rate set by the control system computer and the simulated and increasing solar radiation impinging upon the solar panel. In addition, the amount of change to the temperature of the first tank temperature is a function of any hot water drawn from the first tank, representing hot water use. Withdrawn hot water is replaced by cold water, thereby reducing the temperature of first tank 16.

The control system 40 responds to the actions of the control system simulator 60, first noting the measured mass flow from the simulated glycol flow meter signal 89. The control system computer begins by computing heat transferred per unit time. The computation is performed by multiplying the mass flow rate of glycol by the difference in temperature between the top-of-panel and bottom-of-first-tank. The units of this calculation can be specified by the user of the solar system, being in kW or BTU/hour, for example.

The control system computer 40 then integrates the heat transferred per unit time, thereby producing a measure of heat energy transferred. The units of this calculation similarly can be specified by the user of the solar system, being kW-hour or BTU, for example.

The control system computer 40 then proceeds to execute its hill-finding algorithm in order to maximize energy flow rate by increasing or decreasing the speed of the variable-speed pump 12 by use of signal 81.

The process goes on through the simulated day. At some point, given sufficient solar radiation, the control system computer 40 may determine that it should turn on the fixed-speed pump 22 in order to transfer hot water to second tank 20.

In response to the actuation by the control system computer 40 of the fixed-speed pump 22, the control system simulator 60 will cause second tank 20 to increase in temperature while simultaneously causing the bottom-of-first-tank temperature to decrease as explained earlier.

In the simplest case, this process continues through the simulated day. Increasing complexity may be introduced to the control system simulator, for example simulating a cloudy or rainy day or simulating water being drawn from either the first tank or the second tank. However, this complexity is only indicative of further potential complexity and is not material in this discussion other than to reemphasize the value that such a simulator brings. A primary value of employing such a simulator results from the fact that explicit solutions cannot be pre-programmed into the control system computer. Rather, the control system program can only be designed to respond to changes in its inputs by making corresponding changes to its outputs. There is rarely a one-to-one result to a change. For example, on one day, increasing the fixed-speed pump speed in response to an increase in top-of-panel temperature might result in an increase in heat transfer rate. On another day with different initial conditions, the opposite might be the case. Thus, the simulator allows the control system to be exercised through its state space or range of operating conditions. The overall goal of such a simulation exercise is to design a control system computer program that can maximize the amount of solar energy transferred to the hot water system in the business or home under various weather and operating conditions.

a. Description of the Interconnection of Prior Art Solar Hot Water Simulator Computer to Prior Art Solar Hot Water Control System Computer Referring to FIG. 4, we will now describe the electrical connection 80 between the prior art hot water simulator computer 60 and the prior art solar hot water control system computer 40. Eight devices—six sensors and two actuators—are normally connected to the solar hot water control system computer 40. In order to simulate the function of these eight devices, the control system simulator computer 60 must be electrically connected in the place of these eight devices.

Device #1, Variable Speed Glycol Pump Signal 81: A common 4-20 mA signal is used by the solar hot water control computer 40 to set the speed of the glycol pump 12. Thus a 4 mA signal requests minimum speed while 12 mA requests half speed and 20 mA requests full speed. Values between 4 mA and 20 mA represent proportional speed requests. As is customary in the prior art, power must be provided to the current output module 41 on the solar hot water control computer. Two additional wires connect the current output signals 81 to the current input module 61 on the solar hot water simulation computer 60. As is also customary in the prior art, power must be provided to the current input module 61 on the solar hot water simulator computer. Two wires 81 are run between the solar hot water control 40 computer and solar hot water simulator computer 60. In addition, two wires must connect each of two said modules to its own device power supply 42 and 66.

Device #2, Glycol Pressure Transducer Signal 82: A common 4-20 mA signal is used by the glycol pressure transducer 32 to produce a glycol pressure signal 82. The signal and wiring are different than the case for Device #1 in that one wire is run between the solar hot water control computer 40 and solar hot water simulator computer 60. This difference is reflective of the fact that most pressure transducers such as the glycol pressure transducer 32 are so-called loop powered, thus expecting a power signal that is internally generated by the simulator computer 60. In addition two wires must connect each of two the modules to its own device power supply 42 and 66.

Device #3, Glycol Mass Flow Meter Signal 89: A voltage signal is used by the glycol mass flow meter 18 to transmit the flow information to the solar hot water control computer 40. The mass flow meter 18 produces a voltage proportional to flow rate as is common in the art. Careful wiring is required to avoid connecting the solar hot water control computer device power supply 42 to the solar hot water simulator computer device power supply 66. The reason for this needed care is that the solar hot water control computer must supply power when it is connected to the glycol mass flow meter. However, when the solar hot water simulator computer is connected, this power signal needs to be removed since power to generate the simulated flow signal will emanate from the solar hot water simulator computer device power supply 66. Five wires need to be hooked up to connect the two computers.

Device #4, Top-of-Panel-Temperature-Sensor Signal 83: A common 4-20 mA signal is used to connect four temperature sensors to the solar hot water control computer. When the solar hot water simulator computer 60 is connected in the place of the temperature sensors, power must be carefully accounted for because both the current output module circuit 63 of the solar hot water simulator computer 60 and the current input module circuit 43 of the solar hot water control computer 40 require power. However, if the two device power supplies 42 and 66 are connected, the two power supplies can go into instability causing system failure. Therefore, the two device power supplies must be carefully referenced via their common ground reference connection 84. Wire 84 carries the 4-20 mA signal from the solar hot water control computer 40 to the solar hot water simulator computer 60 Two additional wires 45 and 65 are employed to connect said device power supplies to their respective current module circuits. Our description here is actually simpler than most prior art systems in that it is common to isolate each current input channel each from the other. Therefore, individual power supplies and wiring could be required. We are showing fewer wires than might be expected.

Device #5, Top-of-First-Tank-Temperature-Sensor Signal 85: Identical to Device #4.

Device #6, Bottom-of-First-Tank-Temperature-Sensor Signal 86: Identical to Device #4.

Device #7, Bottom-of-Second-Tank-Temperature-Sensor Signal 87: Identical to Device #4.

Device #8, Fixed-Speed Pump Actuation Signal 88: A digital or on/off signal using common 24 VDC logic is produced by the solar hot water control computer 40.

b. Description of the Interconnection of the Solar Hot Water Simulator Computer of the Present Invention to the Solar Hot Water Control System Computer We now contrast the present invention to the prior art with the benefit of the previously described example solar hot water control system and prior art simulator. Referring to FIG. 5, we depict the interconnection of the solar hot water control system to the simulator of the present invention.

In the preferred embodiment, the configurable, connectorized input/output module 90 contains a 25-pin input/output connector 91. Any number of pins can be used, the appropriate number being driven by commercial and technical needs. The configurable, connectorized module also contains a power connector 92 which connects to a module power supply 93. Electrical power from the module power supply through the power connector has two purposes. First, the power from the module power supply 93 is used to energize the control system simulation computer. Second, the power is also selectively routed via the configurable method and apparatus to certain pins of the said input/output connector 91. We note the distinction from the prior art, which cannot selectively route power via a configurable apparatus, thus requiring cabling or wiring to achieve the same result. We also note that any pin of the configurable connectorized module may be set as an input or an output or power or ground, the input and output signals being of various forms including various voltages, currents or frequency to name a few. In addition, the power may be of various voltages such as 5 volts, 24 volts or other voltages as the application of the invention may require.

A third connector 94 provides network connectivity, such as Ethernet. The network connectivity is used to load software, adjust parameters, visualize the simulation process and record simulation results. As stated previously herein, nothing in this description precludes logically separating part or all of the function of the simulation computer from the configurable connectorized module. Especially in large or complex simulations, employing a larger simulation computer or multiple computers might produce better results. In such a case, however, the module still provides the electrical connection method and apparatus representative of a control system simulator, thereby providing the inventive advantage by simplifying wiring and reducing setup time and the amount of simulator hardware required to realize the simulator functionality.

The interconnection of the configurable connectorized input/output module 90 to the solar hot water control computer 40 as depicted in FIG. 5 is dramatically simpler than the prior art as depicted in FIG. 4. Whereas the same number of signals 81 to 89 interconnect the solar hot water computer 40 and the simulator computer 60 in each figure, ten additional wires must be hand-wired and a second power supply must be attached in the prior art system of FIG. 4 when compared to the present invention depicted in FIG. 5. The present invention of FIG. 5 employs a configurable connectorized method and apparatus in which a standard cable may be attached to the configurable connectorized input/output module 90 and wire ends of said cable may connect to the solar hot water control computer 40. A second device power supply 42 is not required as described earlier. Thus the system of the present invention is simpler, requires fewer interconnections and eliminates many hardware components.

A further advantage of the configurable connectorized input/output module of the present invention is demonstrated by the reduction in input and output modules of the prior art. Referring to FIG. 4, we note that the simulator computer 60 employs four different input/output modules such as 61 and 63. Such modules are large, expensive and are poorly utilized when the number of input and output signals available on the respective modules is considered. By contrast, the system of the present invention in FIG. 5 employs a single configurable connectorized input/output module 90, the module being capable by virtue of the inventive steps of supplying any of the required signals and power on any of its connector pins, thereby offering a dramatic reduction in hardware components and therefore space and cost.

In its most generic implementation, the present invention is electrically connected to a control system typically in use for the past fifty years, and in extensive use today. However, with the invention of the configurable connectorized input/output system, new control system architectures have been applied to a number of control system applications. If the present invention simulator is combined with the control system realized with a configurable connectorized input/output system, significant benefits result. We will now describe the system in which the present invention is combined with a control system realized with a configurable connectorized input/output system.

c. Description of the Interconnection of the Solar Hot Water Simulator Computer of the Present Invention to the Solar Hot Water Control System Computer Employing a Configurable Connectorized Input/Output System The superiority of the present invention, as explained with the illustrative example of a solar hot water simulator, has been demonstrated in its dramatic reduction in hardware components, wiring complexity and, by result, labor. If a similar comparison is now made between this system to a system employing both a solar hot water simulator of the present invention and a solar hot water control system realized with a configurable connectorized input/output system, then a similar degree of improvement may be demonstrated. We will now provide such a comparison.

Figure 6:
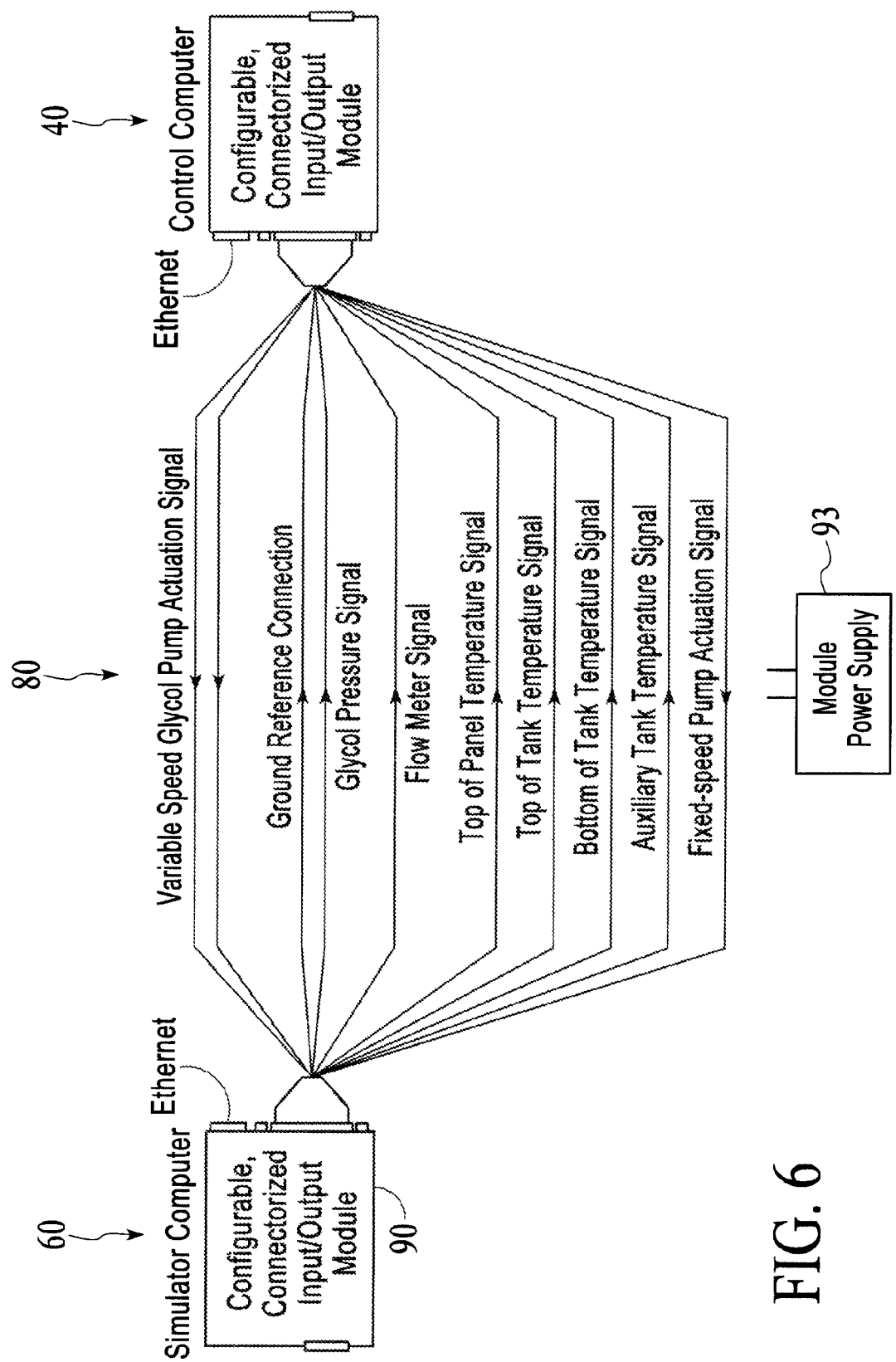
FIG. 6 illustrates a configurable, connectorized input/output module of the present invention configured as a simulation computer with input/output system connected to a second configurable, connectorized input/output module configured as a control system, where the combination simulates the operation of a solar hot water system.

Referring to FIG. 6, we see that the solar hot water simulator computer 60 is unchanged from FIG. 5. However, the large collection of hardware required to realize the solar hot water control computer 40 in FIG. 5 has been dramatically reduced in FIG. 6. The reduction in complexity is a direct result of employing a configurable connectorized input/output module 90 to effect the functionality of the solar hot water control computer 40. Whereas the prior art control system 40 of FIG. 5 required two power supplies, terminal blocks and twenty wires, the solar hot water control system 40 of FIG. 6 requires only ten wires and no terminal blocks, custom cabling or wire harnesses. In addition, the module power supply 93 may now be shared between the solar hot water control system 40 and the solar hot water simulator 60, resulting in further simplification.

Figure 7:
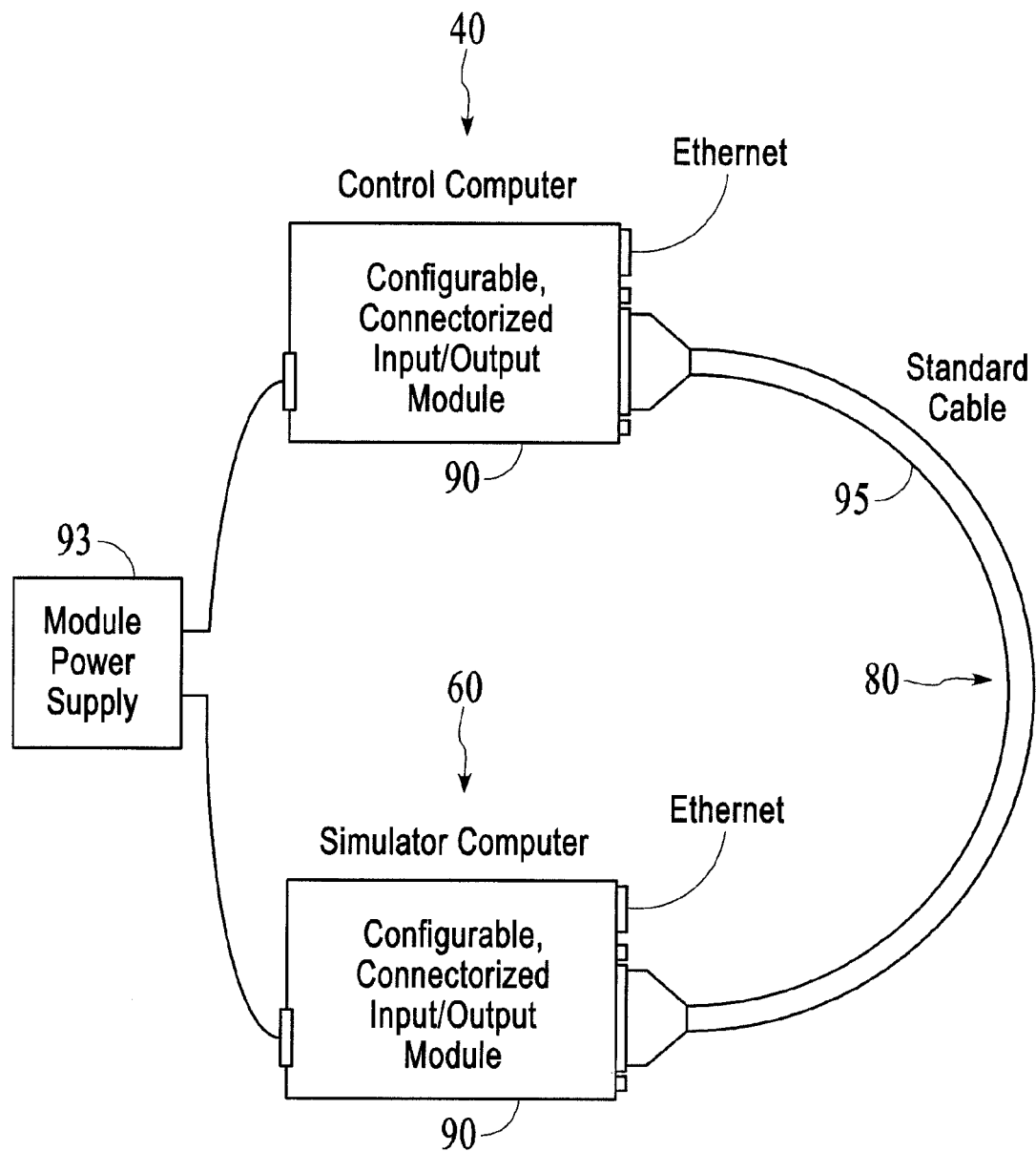
FIG. 7 illustrates the system of FIG. 6 when connected using a standard cable.

An additional benefit of the employment of two configurable connectorized input/output modules 90 to effect the control/simulator system is demonstrated in FIG. 7 where a standard cable 95 is utilized to interconnect the two configurable connectorized input/output modules 90. A standard cable is simply a cable in which each pin is connected via a wire to a pin on the other end of the cable. Such cables may be purchased in numerous stores and websites off-the-shelf. Although standard cables are simple devices, nothing in this description limits the use of other types of cable interconnects in which the cable employs one, two or more than two connectors or where various wires are combined or connected in ways that improve the utilization of signal or power wires. Nonetheless, the use of a standard cable 95 dramatically simplifies and reduces the cost of the solar hot water control system and solar hot water simulator.

Therefore, the configurable connectorized input/output module, by virtue of its ability to route signals and power on any connector pin, allows a significant reduction in wiring complexity, number of parts required and the amount of labor to assemble the system for a simulation computer or a combination of a simulation and control computer. The configurable connectorized input/output module is described below.

Figure 8:
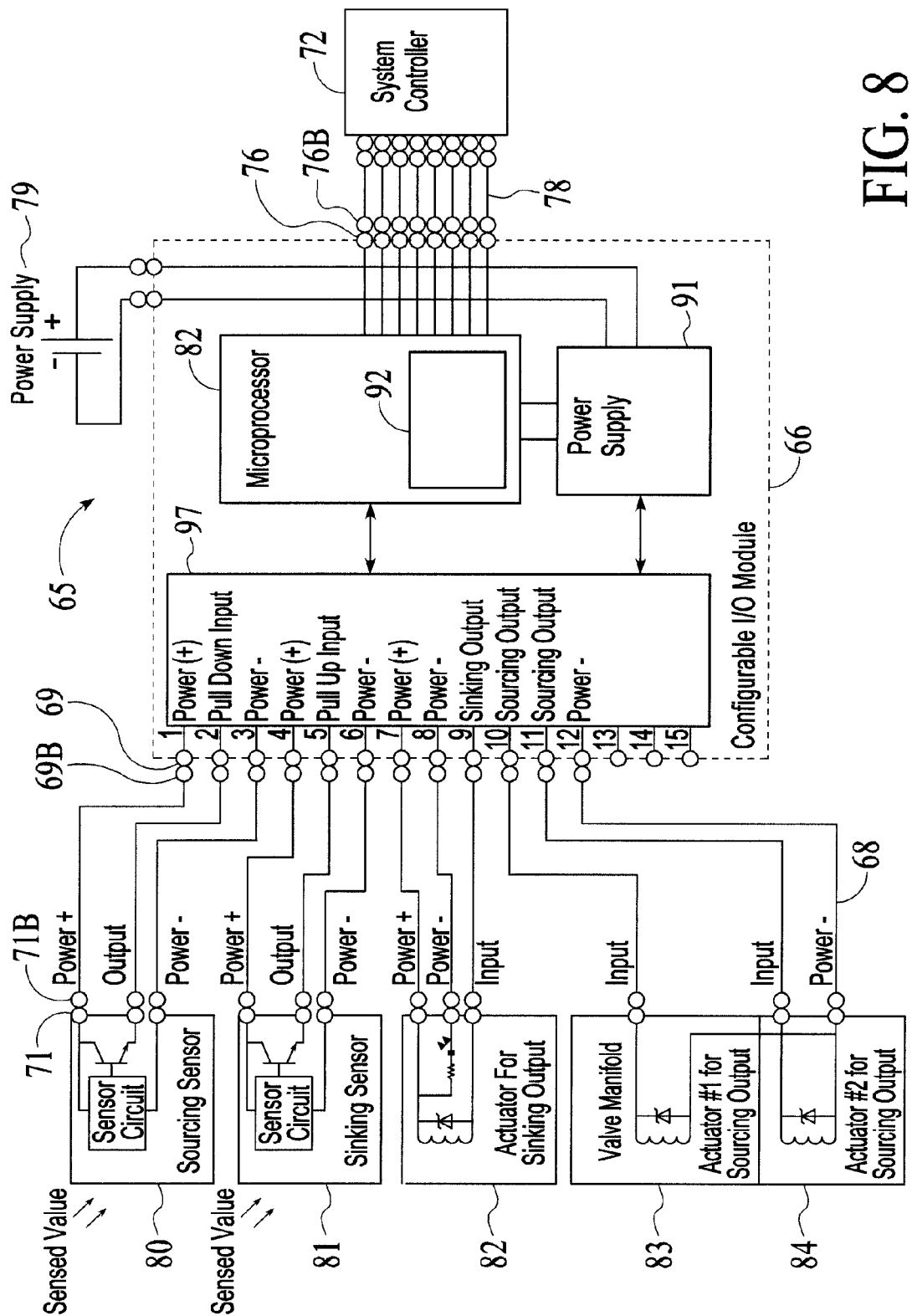
FIG. 8 is a schematic of a configurable input/output system connected to a sinking sensor, a sourcing sensor, an actuator intended to be connected to a sinking output circuit and an actuator intended to be connected to a sourcing output circuit, according to the invention.

In FIG. 8, a block diagram shows a configurable connectorized system including an input/output system 65 connecting sensors and actuators 80-84 to a system controller 72. Configurable input/output system 65 includes an input/output module 66, the module being one or more circuit boards optionally mounted in an enclosure or plugged into a backplane. The module 66 includes one or more device communication connectors 69. The device communication connectors 69 may be a simple terminal block connector to which a single conductor or a plug-type connector may be connected. The plug may hold one or multiple conductors. For clarity, FIG. 8 shows the most general case in which all of the device communication connectors 69 hold a single conductor. The conductors 68 interconnect the devices 80-84 to the configurable input/output module 66. The devices may contain device-end connectors 71 which may or may not be similar to the device communication connectors 69. The conductors 68 may optionally have affixed to them connectors 69B and 71B which mate with the respective input/output module device communication connectors 69 and device-end connectors 71, respectively. Alternatively, the conductors 68 have no connectors 69B and/or 71B and are connected directly to the device communication connectors 69 and/or the device-end connectors 71. Such direct connection could employ terminal block connectors, for example, as described above. The conductors 68 may be grouped into cables. All of the cables 68B are preferably identical, but the present invention also allows for cables 68B with differing numbers and configuration of conductors. The device communication connectors 69 and device-end connectors 71 may similarly be grouped so as to match the number of conductors of the cables. By so doing, an entire cable may be connected/disconnected from either a device or the input/output module or both.

In another alternative, no device-end connector 71 is employed at all, which results if, for example, any device 80-84 is manufactured with a pig tail arrangement where the conductors 68 are already attached to the device. In such a case, the pig tail may be connected directly to device communication connectors 69, which may be a terminal block. Alternatively, the pig tail may have connectors 69B attached to the ends of the conductors, and the connectors may be connected directly to the device communication connectors 69.

The connectors 69B and 71B may be attached to the conductors 68 by being crimped, soldered, welded, brazed or similarly affixed. Alternatively, the conductors may be directly clamped, for example using screw-driven or spring-type terminal blocks, thus obviating the need for one or both mating connectors 69B and 71B.

The configurable input/output module 66 includes a microprocessor 82, an internal power supply 91 and an interface apparatus 97. The internal power supply 91 provides power to the interface apparatus 97, thus enabling power to be supplied from the input/output module 66 to devices 80-84. The internal power supply 97 also provides power for the operation of all components of the module 66. The internal power supply 91 is connected to an external power supply 79. The interface apparatus 97 is described in detail below, with reference to FIG. 10. The microprocessor 82 is programmable for effecting a particular directing of a signal between the configurable input/output module 66 and devices 80-84, and between the module 66 and a system controller 72. The microprocessor contains a buffer memory 92. Controller communication connectors 76 provide connection to a network connection 78 (preferably Ethernet) for communication between the module 66 and the system controller 72. The network connection 78 may be a cable with standard connectors 76B which allow the cable to be readily attached to and detached from the input/output module 66. The network connection 78 may instead be a backplane connector, for example the module 66 may be plugged into a backplane of a PLC or an embedded controller, or the module may function as an embedded controller. The network connection 78 may also utilize wireless technology without departing from the essence of the invention. The system controller 72 is often used to coordinate multiple configurable input/output modules 66. However, the configurable I/O module 66 may operate without connection to the system controller 72. Without departing from the teaching of the present invention, a configurable input/output module 66 may: act as a so-called embedded controller; be a circuit board which is a part of a larger system; or function as the system controller by itself.

Referring to FIG. 8, four different sensors and actuators are shown connected to a single configurable input/output module of the present invention. Specifically, a sourcing sensor 80, a sinking sensor 81, and two actuator types, one designed to be driven by a sourcing output circuit (see 83 & 84) and one designed to be driven by a sinking output circuit (see 82) are connected to the configurable input/output module 66. In contrast, an equivalent prior art system will require four different input/output modules. The present invention accomplishes this requirement with a single, configurable input/output module 66. In addition, the prior art systems do not supply power from input/output modules, whereas the present invention employs a configurable I/O connection that supplies power and a ground return. Finally, the prior art systems poorly utilize the circuits of the four different input and output modules, whereas the present invention utilizes all necessary connections of the configurable input/output module. It should be noted that in the system shown in FIG. 8 three configurable input/output channels are not required for this set of sensors and actuators. These three channels are therefore available for additional sensors and actuators, should they be needed in the future.

FIG. 8 demonstrates the superiority of the present invention over the prior art. With the present invention, far fewer connections are required to achieve the same utility as the prior art. In addition, efficient utilization of the input/output module of the present invention is achieved, making distributed control architectures more attractive.

Figure 9:
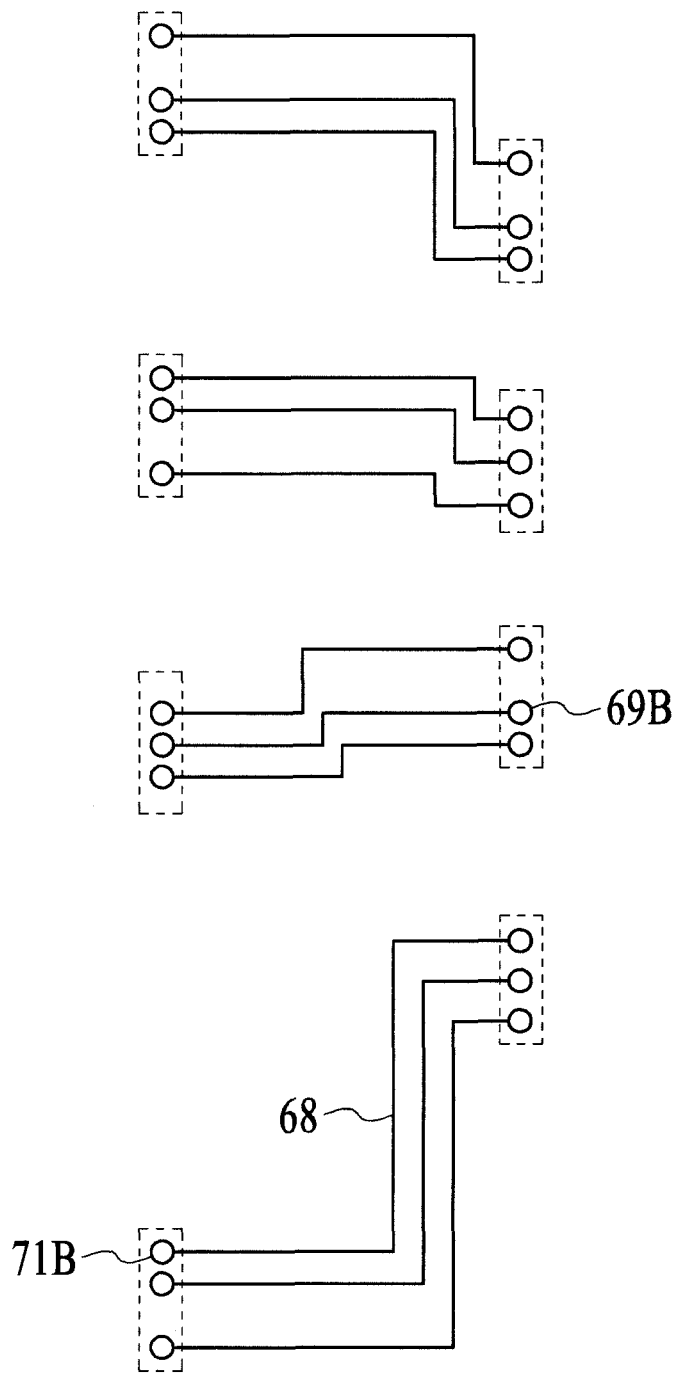
FIG. 9 shows the interconnection wiring of the system of FIG. 8.

FIG. 9 shows the wiring layout for the system of FIG. 8. The conductors are shown in four groups corresponding to the four devices. The conductors in each group may conveniently be combined into a cable, thus four identical cables can be used. FIG. 9 depicts another benefit of the configurable input/output module of the invention. Whereas the wiring of the prior art was necessarily a complex wire harness that defied attempts at simplification, the wiring of the present invention is efficient and simple, for example, consisting of separate, simple cables for each of the sensors and actuators. The nature of the configurable, connectorized input/output module generally allows standard, identical cable sets to be used because the desired signals can be directed onto the desired contacts. This cabling simplification tips the balance between hand-wired terminal block connectors and cables decidedly in the favor of standard cables. Therefore, the present invention reduces the cost and complexity of wiring a control system. Comparing the prior art with the present invention clearly shows how the simplified wire pattern of the present invention encourages cabled, connectorized wiring systems. Being able to use four identical cables greatly simplifies connecting sensors and actuators to the configurable input/output module.

Furthermore, it is clear that the present invention significantly improves the utilization of input/output channels as well as reducing the space required for wiring. Both of these benefits lessen the need to employ centralized control systems, instead making the long-sought distributed control system architectures practical.

The present invention facilitates the use of standard cables for connecting to sensors and actuators. However, the use of hand-wired, single-conductor terminal block connectors is not precluded since this configuration is the simplest of standard cable connections. Some users of input/output systems prefer hand-wired, single-conductor systems. The present invention significantly simplifies such systems and results in much better utilization of the input/output modules.

Figure 10:
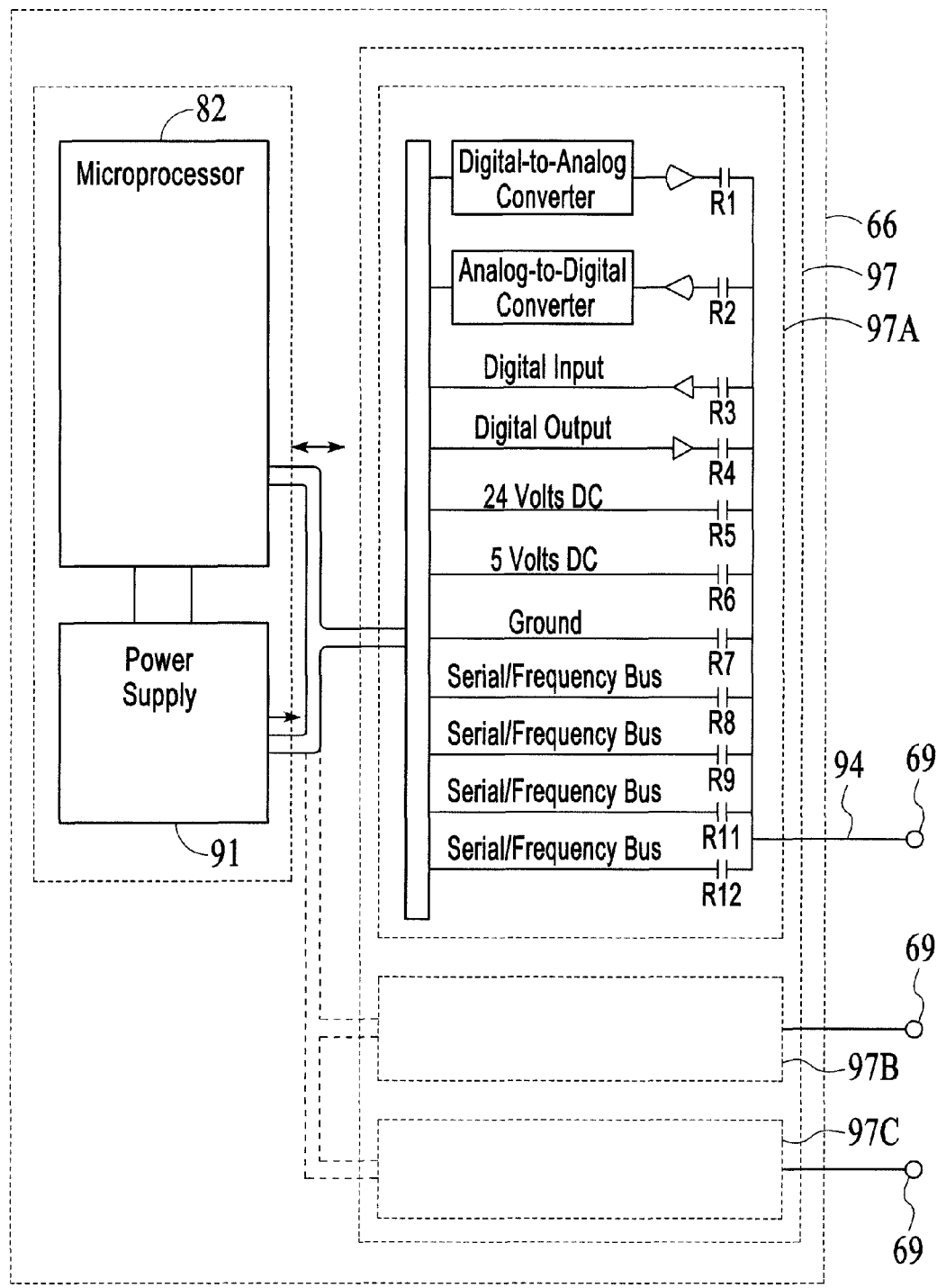
FIG. 10 is a schematic of the configurable interface apparatus, according to the invention.

FIG. 10 shows input/output module 66 with more detail of the interface apparatus 97. The configurable input/output module 66 may contain any number of interface apparatus 97A, 97B, 97C . . . . Each interface apparatus is connected to one device connector 69 and optionally through an internal cross point switch to another interface apparatus. (See FIG. 11 and related description.) Each interface apparatus contains any number of interconnection apparatus, each with a relay. In the particular embodiment shown, there are 12 interconnection apparatus and corresponding relays R1-R12. The interface apparatus 97A is capable of routing any of a plurality of signals and connecting them to the device connector 69. FIG. 10 is highly stylized and is intended to convey the essence of the invention. The interface apparatus, shown in FIG. 10 to comprise interconnection apparatus and relays R1 to R12, are realized with transistors in preferred embodiments.

The interface apparatus, including interconnection apparatus such as those illustrated in FIG. 11, may be configured as an integrated circuit (IC). The IC is repeated within the I/O module 66 for each device connector 69. Thus, if there are 25 device connectors 69, then 25 ICs would be employed. The module 66 can contain any number of ICs, just as any module may contain any number of device connectors 69. Another embodiment may employ a different IC architecture in which multiple device connectors 69 are handled in each IC or multiple ICs are used to handle one or more device connectors. The result of using an IC is a dramatic reduction in the size and cost of building a module 66 by virtue of the miniaturization afforded by modern semiconductor processes.

FIG. 11 is a block diagram of an integrated circuit capable of realizing the interface apparatus, 97A. The integrated circuit 198 has been specifically designed to serve the role of the interconnection apparatus, thus it may be referred to as an Application Specific Integrated Circuit (ASIC). This ASIC is specifically designed to provide the functionality of the interconnection apparatus. At some point in the future, such an ASIC could become a standard product from an integrated circuit vendor. Therefore the term ASIC, as used herein, includes a standard integrated circuit designed to function as the interface apparatus. Furthermore, the term integrated circuit (IC), as it is used herein is intended to cover the following range of devices: ASICs, hybrid ICs, low temperature co-fired ceramic (LTCC) hybrid ICs, multi-chip modules (MCMs) and system in a package (SiP) devices. Hybrid ICs are miniaturized electronic circuits that provide the same functionality as a (monolithic) IC. MCMs comprise at least two ICs; the interface apparatus of the present invention may be realized by a MCM where the required functionalities are divided between multiple ICs. A SiP, also known as a Chip Stack MCM is a number of ICs enclosed in a single package or module. A SiP can be utilized in the current invention similarly to a MCM. In theory, programmable logic devices might be used to realize the interface apparatus of the present invention. However, currently available programmable logic devices, such as field programmable gate arrays (FPGAs), have a number of functional limitations that make their use undesirable—for example an FPGA cannot route power or ground to a given pin.

FIG. 11 depicts a block diagram of a pin driver ASIC 198. When connected to the microprocessor 82 by a serial communication bus 206 such as an SPI interface, the microprocessor 82 of FIG. 10 can command the ASIC 198 to perform the functions of the circuits of interconnection apparatus 97A. Although the circuitry of FIG. 11 appears different from the interconnection apparatus 97A, the ASIC 198 is capable of performing the same or similar required functions. Whereas FIG. 10 is a somewhat idealized diagram intended to convey the essence of the invention, FIG. 11 contains more of the circuit elements that one would place inside an ASIC. Nonetheless, FIG. 11 implements all the circuit elements of FIG. 10. For example, FIG. 10 shows a digital-to-analog converter (D/A or DAC) connectable to the device communication connector 69. In FIG. 11, the digital-to-analog converter 226 is connected to the output pin 208 via the switch 220. The present invention also includes other circuit arrangements for an ASIC 198 for the same or similar purpose. Those skilled in the art will know how to design various such circuitry, and these are to be included in the present invention.

Exemplary features of the ASIC of FIG. 11 will now be briefly described. Power may be applied to pin 208 by closing high current switch 222b and setting the supply selector 227 to any of the available power supply voltages such as 24-volts, 12-volts, 5-volts, ground or negative 12-volts.

The ASIC can measure the voltage on pin 208 by closing the low current switch 222 and reading the voltage converted by the analog-to-digital converter 216.

A thermocouple temperature sensor can be directly connected to ASIC 198 at point/pin 208, wherein the sensor produces a very low voltage signal. A cross-point switch 210 allows a precision differential amplifier 212 to connect to both leads of the thermocouple, one lead of the thermocouple being connected to the node/pin 208 connected to a pin of a connector 69 (FIG. 10), and the second lead of the thermocouple connected to another pin of the connector 69, which is connected to a 4-way cross-point I/O 214 connector. The cross-point switch 210 therefore allows two adjacent pins of a connector 69 to be connected to the same analog-to-digital converter 216 via a differential amplifier 212.

ASIC 198 has the ability to measure the amount of current flowing in or out of the node 208 labeled "Pin" in FIG. 11. The pin driver circuit 198 in this case uses its A/D converter 216 to measure current flowing into or out of the pin node 208, thereby enabling the detection of excessive current, or detecting whether a device connected to the Pin node 208 is functioning or wired correctly.

ASIC 198 also has the ability to monitor the current flow into and out of the pin node 208 to unilaterally disconnect the circuit 198, thereby protecting the ASIC 198 from damage from short circuits or other potentially damaging conditions. The ASIC 198 employs a so-called "abuse detect circuit" 218 to monitor rapid changes in current that could potentially damage the ASIC 198. Low current switches 220, 221 and 222 and high current switch 222b respond to the abuse detect circuit 218 to disconnect the pin 208.

The ASIC 198 abuse detect circuit 218 has the ability to establish a current limit for the pin 208, the current limit being programmatically set by the microprocessor 82. This is indicated by selections 224.

The ASIC 198 can measure the voltage at the pin node 208 in order to allow the microprocessor 82 to determine the state of a digital input connected to the pin node. The threshold of a digital input can thereby be programmed rather than being fixed in hardware. The threshold of the digital input is set by the microprocessor 82 using the digital-to-analog converter 226. The output of the digital-to-analog converter 226 is applied to one side of a latching comparator 225. The other input to the latching comparator 225 is routed from the pin 208 and represents the digital input. Therefore, when the voltage of the digital input on the pin 208 crosses the threshold set by the digital-to-analog converter, the microprocessor 82 is able to determine the change in the input and thus deduce that the digital input has changed state.

The ASIC 198 can receive or produce frequency signals. If a serial communication device, for example a printer, is connected to pin 208, then the frequency signals can be routed through the low current switch 221 and thence to a universal asynchronous receiver transmitter (UART) or similar circuit element (not shown) that can interpret the frequency information. All of the ASICs 198 in a module 66 (see FIG. 10) can route the frequency information to one of four wires that make up the frequency bus 230. By employing the frequency bus 230, it is possible for the module 66 to receive and transmit frequency signals configured as either single-ended or differential. Such serial electrical standards as RS-422 provide for differential serial information.

The ASIC 198 can produce a current source at the pin node, the current source being a standard method of connecting various industrial control devices. The ASIC 198 can produce signals varying over the standard 4-20 mA and 0-20 mA range. This current source means is accomplished by the microprocessor 82 as it causes the digital-to-analog converter 226 to produce a voltage which is routed to a Selectable Gain Voltage Buffer or Current Driver 231 and then through a selectable source resistor 227, the selectable source resistor 227 being set to the appropriate resistance, by the microprocessor 82, to achieve the desired output current. The current is regulated by the Selectable Gain Voltage Buffer or Current Driver 231 using feedback through the analog switch 229 using path A.

The ASIC 198 can measure a current signal presented at the pin node, the current signal being produced by various industrial control devices. The ASIC 198 can measure signals varying over the standard 4-20 mA and 0-20 mA ranges. This current measurement means is accomplished by the microprocessor 82 as it causes the selectable gain voltage buffer 231 to produce a convenient voltage such as zero volts at its output terminal. At the same time, the microprocessor 82 causes the selectable source resistor 228 to present a resistance to the path of current from the industrial control device and its current output. This current enters the ASIC 198 via the pin 208. The imposed voltage on one side of a known resistance will cause the unknown current from the external device to produce a voltage on the pin 208 which is then measured via the analog-to-digital converter 216 through the low current switch 222. The microprocessor 82 uses Ohm's Law to solve for the unknown current being generated by the industrial control device.

Other enhancements of the present invention include the ability of the module 66 to perform independent control of devices connected to the module 66. If, for example, a thermocouple or other temperature sensor is connected to the module 66 along with a heater, then the microprocessor 82 can read the temperature sensor, and activate the heater in such a manner that a desired temperature is achieved. The heater usually employs an amplifier (for example a relay) which converts the low-level output of the module 66 into a high-power output capable of driving a heater. The module 66 can thereby perform closed loop control. In such a case, the thermocouple would be connected to two adjacent pins 208 configured as inputs, while the heater would be connected to two pins 208, the heater pins being configured as outputs. In operation, the microprocessor 82 would measure the voltage of the temperature sensor as described above. The microprocessor 82 would apply the desired temperature using known control algorithms to the measured temperature and develop an actuation signal also using the accepted methods. The microprocessor would then actuate the heater either with a continuously variable analog signal or via a pulse width modulated (PWM) on/off signal. Thus, independent control of devices connected to the module 66 is achieved.

The ASIC 198 includes functions as described above in reference to the interface apparatus 97. For example, an ASIC 198 can include an interconnection apparatus including a digital-to-analog converter 226, wherein the microprocessor 82 is programmable to direct the reception of a digital signal from the microprocessor 82 and cause the signal to be converted by the digital-to-analog converter 226 to an analog signal, and to place a copy of the analog signal on the pin 208. See FIGS. 10 and 11.

The ASIC 198 can also include an interconnection apparatus including an analog-to-digital converter 216, and wherein the microprocessor 82 is programmable to detect an analog signal on any selected contact 69 and cause the analog-to-digital converter 216 to convert the signal to a digital signal and output a copy of the digital signal to the microprocessor 82.

The ASIC 198 can also include a supply selector 227, and a high current switch 222b positioned between the selector 227 and the pin 208. The microprocessor 82 is programmable to operate a supply selector 227 to cause a power supply voltage to be connected to a first contact 69, and to cause a power supply return to be connected to a second contact 69.

Referring to FIG. 11, there is a 2×8 cross-point switch 210, that serves to connect a sensor to two adjacent pins 208 which are in turn connected to two adjacent device communication connectors 69. The cross-point switch 210 allows a sensor such as a thermocouple to be connected to a precision differential amplifier 212. The precision differential amplifier 212 may be connected via the low current switch 222 and the 2×8 cross-point switch 210 to the 4-way cross-point I/O 214 and then to another 4-way cross-point I/O 214 on an adjacent integrated circuit 19 (the integrated circuit for an adjacent contact 69).

Referring to FIGS. 8 and 10, the microprocessor 82 is generally configured/programmed by a controller 72 to receive instruction from the controller as required to sense a particular selected one of devices 80-81 or actuate one of devices 82-84 and provide the corresponding data to the system controller. The microprocessor 82 is also programmed/directed by the controller 72 to cause a particular signal to be applied to any selected one or more contacts 69 and thereby corresponding conductors 68. In addition, the microprocessor 82 is programmed to respond to direction to send a selected signal type from one or more of devices 80-84 to the system controller 72. In other words, the microprocessor controls the configuration of the interface apparatus 97 and generally the microprocessor is controlled by the system controller. Alternatively, the interface apparatus can be configured in response to a message stored in the memory of the microprocessor 82 of the module 66. In another alternative method, the interface apparatus can be configured in response to a set of jumper blocks installed on the module circuit board, wherein inserting or removing the jumper blocks determines the configuration.

In preferred embodiments, the microprocessor 82 has an embedded web server. A personal computer may be connected to the system 65 using an Ethernet cable or a wireless communication device and then to the Internet. Here the personal computer may also be a system controller. The embedded web server provides configuration pages for each device connected to the module 66. The user then uses a mouse, or other keyboard inputs, to configure the device function and assign input/output pins. The user may simply drag and drop icons on the configuration page to determine a specific interconnection apparatus for each of the contacts.

As an example of the operation of the system 65, the microprocessor 82 may be programmed to recognize particular input data, included for example in an Ethernet packet on network cable 78 containing instructions to transmit the data as an analog signal on a particular line 94 to a particular one of devices 80-84. The programming in this case would instruct the microprocessor to direct/convert the data through apparatus having a digital to analog converter in interface apparatus 97. Facility for making this connection is symbolized by relay "R1" which would be activated to make the required connection. As another example, if line 94 were to carry 5 volts to the one of devices 80-84, the microprocessor 82 would be programmed to respond to a signal from the controller 72 to activate relay R6. In this manner, the system 65 allows communication of a selected variety through any line such as 94, and application of any one of a variety of signals to be sent to any selected line such as 94 and thence to a corresponding device.

The circuit switching apparatus (R1-R12) are shown diagrammatically as electromechanical relays. In one embodiment, this switching apparatus is realized in a semiconductor circuit. (See FIG. 11 and related description.) A semiconductor circuit can be realized far less expensively and can act faster than an electromechanical relay circuit. An electromechanical relay is used in order to show the essence of the invention.

Figure 12:
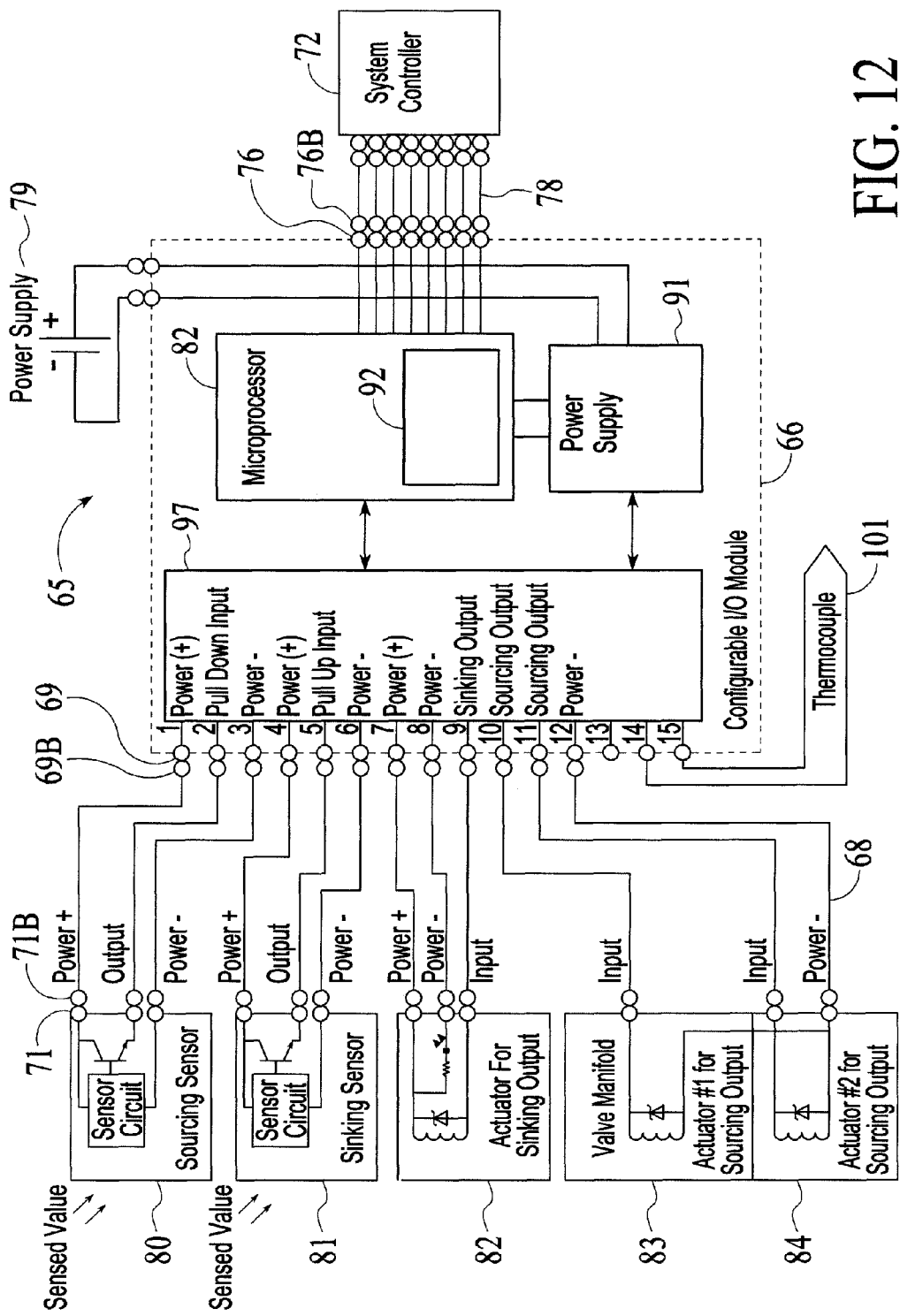
FIG. 12 is a schematic of a configurable input/output system as in FIG. 8 with the addition of a thermocouple connected in such a manner as to measure the differential voltage across the thermocouple, according to the invention.

FIG. 12 further demonstrates the advantages of configurable adjacent connections of the present invention. FIG. 12 shows a thermocouple 101 added to the system of FIG. 8. As discussed above, the embodiment shown in FIG. 8 is more efficient than the prior art in terms of channels used. Three channels remain unused in the system shown in FIG. 8, specifically device communication connectors numbers 13, 14 and 15. In FIG. 12, the thermocouple, a type of temperature sensor, is connected to communication connectors 14 and 15. In order to measure the small thermocouple voltage accurately, a precision differential amplifier 212 is connected to the thermocouple using the cross-point switch 210. See FIG. 11.

FIG. 12 illustrates the ability of a single configurable input/output module 66 to make connections to sourcing, sinking, digital and analog sensors and actuators simultaneously. Thus making efficient use of the available channels on the I/O module. In contrast, a fixed-configuration prior art input/output module cannot accommodate more than one of these disparate devices.

While a particular embodiment of the present invention has been shown and described, it will be obvious to those skilled in the art that changes and modifications may be made without departing from the spirit of the present invention, and therefore the appended claims are to include these changes and alterations as follow within the true spirit and scope of the present invention.

What is claimed is:

1. A process simulation system for a control system of a physical process comprising:
   (a) a configurable connector module including:
      (i) a device communication connector apparatus for connecting at least one conductor between said module and at least one control system input or output signal; and
      (ii) interface apparatus for causing said module to place any of a plurality of signals on any of a plurality of contacts of said device communication connector apparatus, wherein said interface apparatus includes at least one electronic integrated circuit providing a selectable interconnection apparatus to a particular one of said contacts, wherein said interface apparatus is configurable by a user of said system; and
   (b) a simulator for managing a plurality of signals corresponding to a simulated physical process; and
   (c) a module power supply for energizing the configurable connector module and the simulator, wherein power is selectively routed by the configurable connector module to power selected contacts of the configurable connector module and to power the simulator, whereby the operations of the control system during the physical process are simulated.

2. The process simulation system of claim 1, wherein the simulator is external to the module.

3. The process simulation system of claim 2, wherein the simulator is connected to the module via a network connection.

4. The process simulation system of claim 1, wherein the simulator is internal to the module.

5. The process simulation system of claim 1, further comprising a second configurable connector module, wherein the second module is configured to simulate the control system.

* * * * *